(12) United States Patent
Skarica et al.

(10) Patent No.: US 11,455,336 B2
(45) Date of Patent: Sep. 27, 2022

(54) QUADCOPTER HARDWARE CHARACTERIZATION AND SIMULATION

(71) Applicant: PERFORMANCE DRONE WORKS LLC, Huntsville, AL (US)

(72) Inventors: Vedran Skarica, Zagreb (HR); Ryan Gury, Mount Vernon, NY (US); Eduardo Dias da Costa, Porto Alegre (BR)

(73) Assignee: Performance Drone Works LLC, Huntsville, AL (US)

( * ) Notice: Subject to any disclaimer, the term of this patent is extended or adjusted under 35 U.S.C. 154(b) by 860 days.

(21) Appl. No.: 16/361,041

(22) Filed: Mar. 21, 2019

(65) Prior Publication Data

US 2020/0301971 A1    Sep. 24, 2020

(51) Int. Cl.
*G06F 16/901* (2019.01)
*B64C 39/02* (2006.01)
(Continued)

(52) U.S. Cl.
CPC .......... *G06F 16/9017* (2019.01); *B64C 27/08* (2013.01); *B64C 27/16* (2013.01);
(Continued)

(58) Field of Classification Search
CPC ...... G06F 16/9017; G06F 30/20; G06F 17/00; G06F 30/25; G06F 30/27; G06F 30/28;
(Continued)

(56) References Cited

U.S. PATENT DOCUMENTS 6,163,763 A  12/2000  Cox et al.
6,195,626 B1  12/2001  Stone
(Continued)

FOREIGN PATENT DOCUMENTS

CN  103365773 A  10/2013
CN  106716272 B  3/2021
(Continued)

OTHER PUBLICATIONS

Johnson et al. "Use of Flight Simulation to Complement Flight Testing of Low-Cost UAVS" AIAA Modeling and Simulation Technologies Conference and ExhibitAug. 6-9, 2001 Montreal, Canada (Year: 2001).*

(Continued)

*Primary Examiner* — Rehana Perveen
*Assistant Examiner* — Troy A Maust
(74) *Attorney, Agent, or Firm* — Vierra Magen Marcus LLP

(57) ABSTRACT

A method of simulating a quadcopter includes testing a plurality of quadcopter components at a plurality of operating conditions to generate one or more lookup tables for characteristics of the quadcopter components. The lookup tables are stored for quadcopter component simulation in a quadcopter simulator. When a simulated input value for a simulated quadcopter component is received in the simulator lookup table, entries corresponding to the simulated input value are read from the lookup table and simulated quadcopter component output is generated. Simulated quadcopter output to a flight controller is generated according to the simulated quadcopter component output from one or more entries of one or more lookup tables.

20 Claims, 25 Drawing Sheets

(51) Int. Cl.
  *B64C 27/16* (2006.01)
  *G08G 5/00* (2006.01)
  *B64C 27/08* (2006.01)
  *G06F 30/20* (2020.01)
(52) U.S. Cl.
  CPC ............ *B64C 39/024* (2013.01); *G06F 30/20* (2020.01); *G08G 5/003* (2013.01); *B64C 2201/108* (2013.01); *B64C 2201/12* (2013.01); *B64C 2201/146* (2013.01)
(58) Field of Classification Search
  CPC .. G06F 2111/00–2119/22; B64C 27/08; B64C 27/16; B64C 39/024; B64C 2201/108; B64C 2201/12; B64C 2201/146; G08G 5/003; G08G 5/0013; G08G 5/0069; G08G 5/0095
  See application file for complete search history.

(56) References Cited

U.S. PATENT DOCUMENTS

| | | |
|---|---|---|
| 7,302,316 B2 | 11/2007 | Beard et al. |
| 9,545,995 B1 | 1/2017 | Chau et al. |
| 9,984,586 B2 | 5/2018 | Popa-Simil et al. |
| 10,474,934 B1 | 11/2019 | Cosic |
| 10,705,525 B2 | 7/2020 | Smolyanskiy et al. |
| 10,884,902 B2 | 1/2021 | Kislovskiy et al. |
| 2004/0002796 A1 | 1/2004 | Shimel |
| 2008/0307496 A1 | 12/2008 | Kurose |
| 2009/0228253 A1 | 9/2009 | Tolone et al. |
| 2010/0256961 A1 | 10/2010 | Bush |
| 2016/0188765 A1 | 6/2016 | Vossler et al. |
| 2016/0306981 A1 | 10/2016 | Hoog et al. |
| 2017/0076194 A1 | 3/2017 | Versace |
| 2017/0097640 A1 | 4/2017 | Wang et al. |
| 2017/0144755 A1 | 5/2017 | Howard |
| 2017/0190423 A1* | 7/2017 | Salgueiro .............. B64C 39/024 |
| 2017/0255198 A1 | 9/2017 | Rodriguez |
| 2018/0002018 A1 | 1/2018 | Jourdan |
| 2018/0025650 A1 | 1/2018 | Traveira |
| 2018/0032040 A1 | 2/2018 | Sweet, III et al. |
| 2018/0046187 A1 | 2/2018 | Martirosyan et al. |
| 2018/0098463 A1 | 4/2018 | Campbell et al. |
| 2018/0158197 A1 | 6/2018 | Dasgupta et al. |
| 2019/0056725 A1 | 2/2019 | Su |
| 2019/0332892 A1 | 10/2019 | Wickesberg |
| 2019/0354116 A1 | 11/2019 | Shomin et al. |
| 2020/0019189 A1 | 1/2020 | Chen et al. |
| 2020/0108914 A1 | 4/2020 | Yoo et al. |
| 2020/0125956 A1 | 4/2020 | Ravi et al. |
| 2020/0299001 A1 | 9/2020 | Restifo et al. |

FOREIGN PATENT DOCUMENTS

| | | |
|---|---|---|
| JP | 6239619 B2 | 11/2017 |
| KR | 20180071615 A | 6/2018 |

OTHER PUBLICATIONS

Response to Office Action dated Oct. 7, 2021, U.S. Appl. No. 16/360,999, filed Mar. 21, 2019.
Response to Office Action dated Apr. 15, 2022, U.S. Appl. No. 16/360,999, filed Mar. 21, 2019.
Restifo, et al., "Modular Autonomous Drone," U.S. Appl. No. 16/360,999, filed Mar. 21, 2019.
Restifo, et al., "Quadcopter Artificial Intelligence Controller and Quadcopter Simulator," U.S. Appl. No. 16/361,013, filed Mar. 21, 2019.
Restifo, et al., "Autonomous Quadcopter Piloting Controller and Debugger," U.S. Appl. No. 16/361,031, filed Mar. 21, 2019.
Skarica, "Quadcopter Sensor Noise and Camera Noise Recording and Simulation," U.S. Appl. No. 16/361,051, filed Mar. 21, 2019.
AWS DeepRacer—Overview, Amazon Web Services, Inc., retrieved on Jan. 30, 2019 available at: https://aws.amazon.com/deepracer/.
Tung, "Microsoft open-sources its drone simulator: Now you can crash robots, self-driving," Feb. 16, 2017, Available at https://www.zdnet.com/article/microsoft-open-sources-its-drone-simulator-now-you-can-crash-robots-self-driving-cars/.
"Open Kinetic AI: a framework fo rintelligent motions of Robots," GitHub, Inc., retrieved on Jan. 30, 2019, Available at https:github.com/yankailab/OpenKAI.
"Precision Time Protocol,(PTP/IEEE-1588)," EndRun Technologies, retrieved on Feb. 13, 2019, Available at http://endruntechnologies.com/resources/white-papers.
Zou, "ROS+Gazebo Quadrotor Simulator," Key Lab of Navigation and Location-based Service, Jul. 14, 2014.
SITL Simulator (Software in the Loop), ArduPilot Dev Team, retrieved on Jun. 20, 2019, Available at http://ardupilot.org/dev/docs/sitl-simulator-software-in-the-loop.html#sitl-simulator-software-in-the-loop.
Skydio R1, Skydio, Inc., retrieved Jan. 23, 2019, Available at https://www.skydia.com/technology/.
Lindvall, Mikael, et al., "Metamorphic Model-based Testing of Autonomous Systems," IEEE/ACM 2nd International Workshop on Metamorphic Testing (MET), May 2017, 8 pages.
Czerniejewski, Adam, et al., "jUAV: A Java Based System for Unmanned Aerial Vehicles," ACM, Aug. 2016, 10 pages.
Desai, Ankush, et al., "Combining model checking and runtime verification for safe robotics," UC Berkeley, Sep. 2017, 20 pages.
Lu, Peng, et al., "Real-time Simulation System for UAV Based on Matlab/Simulink," IEEE, Sep. 2011, 6 pages.
Prosvirin, D.A., et al., "Model-Based Solution and Software Engineering Environment for UAV Critical Onboard Applications," IEEE 3rd International Conference Actual Problems of Unmanned Aerial Vehicles Developments (APUAVD) Proceedings, Oct. 2015, 3 pages.
Schmittle, Matt, et al., "Open UAV: A UAV Testbed for the CPS and Robotics Community," 9th ACM/IEEE International Conference on Cyber-Physical Systems, Apr. 2018, 9 pages.
English Abstract of CN Publication No. CN103365773 published Oct. 23, 2013.
English Abstract of CN Publication No. CN106716272 published Mar. 9, 2021.
English Abstract of JP Publication No. JP6239619 published Nov. 9, 2017.
Notice of Allowance dated Feb. 22, 2022, U.S. Appl. No. 16/361,031.
Non-final Office Action dated Apr. 30, 2021, U.S. Appl. No. 16/360,999, filed Mar. 21, 2019.
Purdue University, "Airblock: Modular & Programmable Drone," Webpage, retrieved from the internet on Apr. 21, 2021, [https://engineering.purdue.edu/INSPIRE/Reviews/toys/airblock-the-modular-and-programmable-drone], 2 pages.
Non-Final Office Action dated Jan. 18, 2022, U.S. Appl. No. 16/360,999, filed Mar. 21, 2019.
Non-Final Office Action dated Feb. 3, 2022, U.S. Appl. No. 16/361,013, filed Mar. 21, 2019.
Vincent, James, "AI drone pilots will challenge humans in competition sponsored by Lockheed Martin," The Verge, Sep. 5, 2018, 4 pages.
Gupta, Pradeep Kumar, "An Overview of Nvidia's Autonomous Vehicles Platform," NVIDIA, Aug. 2017, 53 pages.
Codevilla, Felipe, et al., "End-to-end Driving via Conditional Imitation Learning," arXiv:1710.02410v2 [cs.RO], Mar. 2, 2018, 8 pages.
Koch, William, et al., "Reinforcement Learning for UAV Attitude Control," ACM Transactions on Cyber-Physical Systems, vol. 3, No. 2, Article 22, Feb. 2019, 21 pages.
Eggert, Daniel, "Communicating with the Quadcopter,"Objc, Issue 8: Quadcopter Project, Jan. 2014, 18 pages.
Gelbal, Sukru Y., "A Connected and Autonomous Vehicle Hardware-in-the-Loop Simulator for Developing Automated Driving Algorithms," IEEE International Conference on Systems, Mans, and Cybernetics (SMC), Oct. 2017, 6 pages.
Dosobitskiy, Alexey, et al., "CARLA: An Open Urban Driving Simulator," 1st Conference on Robot Learning, 2017, 16 pages.

(56) References Cited

OTHER PUBLICATIONS

Polvara, Riccardo, et al., "Toward End-to-End Control for UAV Autonomous Landing via Deep Reinforcement Learning," International Conference on Unmanned Aircraft Systems (ICUAS), Jun. 2018, 9 pages.

HDMI-to-CSI_2016 (B100 HDMI to CSI-2 Bridge, Auvidea, 2016, 3 pages.

Pokhrel, Niroj, "Drone Obstacle Avoidance and Navigation using Artifical Intelligence," Master's Thesis, Aalto University, School of Science, Degree Programme of Computer Science and Engineering, Apr. 20, 2018, 113 pages.

Advisory Action dated Oct. 21, 2021, U.S. Appl. No. 16/360,999, filed Mar. 21, 2019.

Ertin, et al., "Hardware-in-the-loop Test Platform for a Small Fixed Wing Unmanned Aerial Vehicle Embedded Controller," Proceedings of the IASTED International Conference on Modelling, Identification and Control, Mar. 2013, DOI—10.2316/P.2013.794-059.

ArduPilot Dev Team, "X-Plane Hardware in the Loop Simulation," 2019, Available at: http://ardupilot.org/dev/docs/x-plane-hardware-in-the-loop-simulation.html.

Response to Office Action dated May 3, 2022, U.S. Appl. No. 16/361,013, filed Mar. 21, 2019.

Notice of Allowance dated May 4, 2022, U.S. Appl. No. 16/360,999, filed Mar. 21, 2019.

Response to Non-final Office Action dated Jul. 29, 2021, U.S. Appl. No. 16/360,999, filed Mar. 21, 2019.

Final Office Action dated Aug. 27, 2021, U.S. Appl. No. 16/360,999, filed Mar. 21, 2019.

\* cited by examiner

QUADCOPTER HARDWARE CHARACTERIZATION AND SIMULATION

BACKGROUND

Radio controlled unmanned aircraft (e.g. drones, such as quadcopters) can move at high speed and make rapid changes in direction when remotely piloted by a skilled user. In drone racing, users race their respective drones around a course using remote-controls to maneuver around the course (e.g. through gates, around obstacles, etc.). A camera view from a drone may be relayed to a user to allow a First Person View (FPV) so that the user can see where the drone is going and steer it accordingly in the manner of a pilot sitting in the cockpit of an aircraft.

A drone may include a flight controller that provides output to motors and thus controls propeller speed to change thrust. For example, a quadcopter has four motors, each coupled to a corresponding propeller, with propellers mounted to generate thrust substantially in parallel (e.g. their axes of rotation may be substantially parallel). The flight controller may change speeds of the motors to change the orientation and velocity of the drone and the propellers may remain in a fixed orientation (i.e. without changing the angle of thrust with respect to the quadcopter) and may have fixed-pitch (i.e. propeller pitch may not be adjustable like a helicopter propeller so that each motor powers a corresponding fixed-pitch propeller in a fixed orientation with respect to a drone chassis). The flight controller may be directed by commands received from the user's remote-control and may generate outputs to motors to execute the commands.

DETAILED DESCRIPTION

Figure 1:
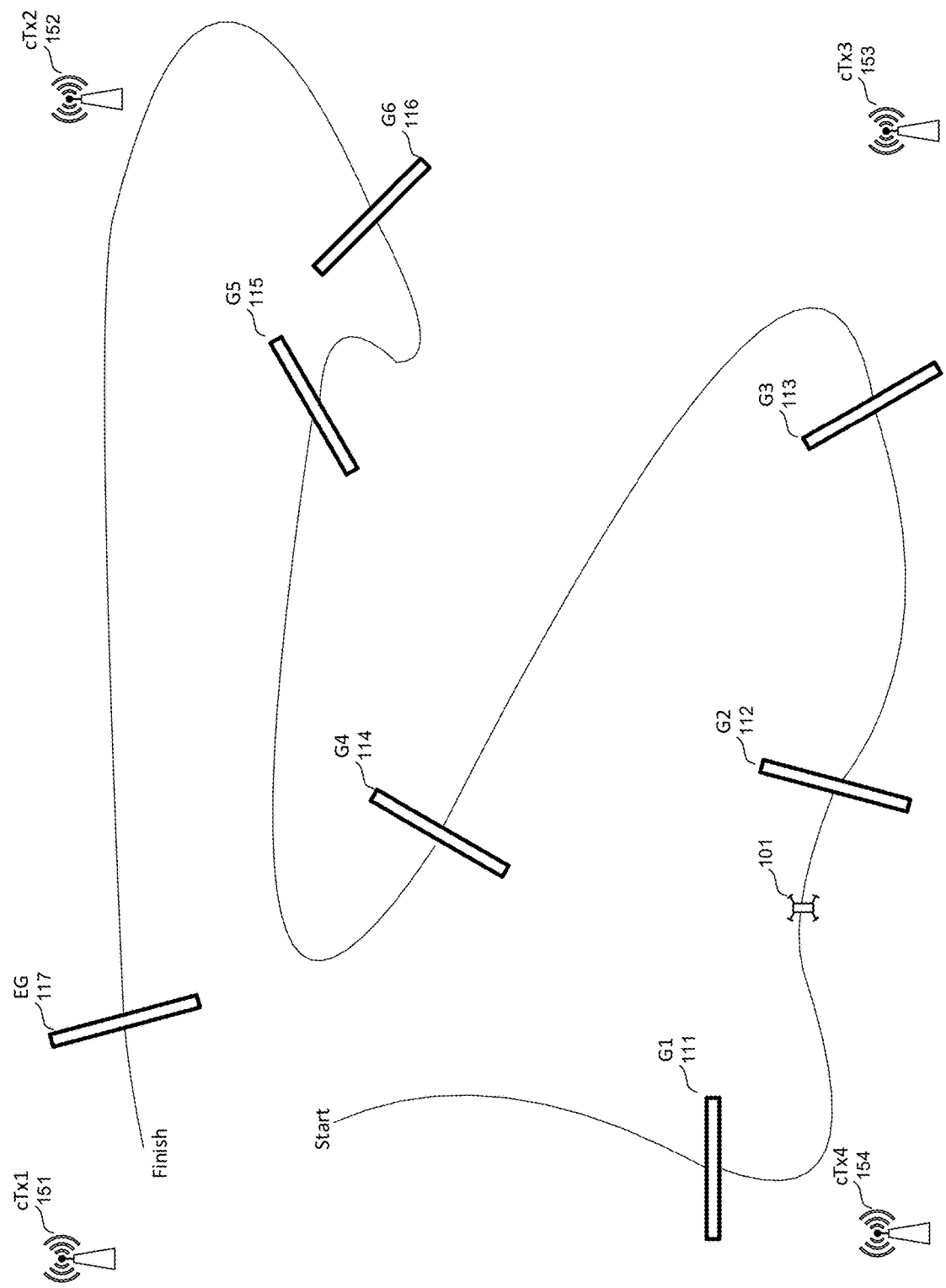
FIG. 1 is a top view of an example of a course and a drone moving along a path through the course.

The following presents a system and techniques for an autonomous drone such as an autonomous quadcopter that includes an Artificial Intelligence (AI) controller that is separate from a flight controller and that provides input to the flight controller to pilot the drone. The AI controller may provide all commands needed by the flight controller and thus may take the place of a user using a remote-control (e.g. a human pilot flying the drone by remote-control). The AI controller may use Computer Vision (CV) based on multiple cameras (e.g. six cameras configured as three stereoscopic cameras) to pilot the drone based on visual input from the environment, determining the flightpath in real time rather than flying along a predetermined flightpath. A drone equipped with such an AI controller may be an autonomous drone that does not require human input to fly around a course (e.g. a race course). The AI controller may be coupled to other drone components (e.g. flight controller) through a connector so that the AI controller is removable from the drone, allowing the drone to be configured for remote-control (without the AI controller) and for autonomous flight (with the AI controller). The drone may also be switchable between autonomous and remote-control modes without physically removing the AI controller (e.g. a remote-control may send a command to change from autonomous mode to remote-control mode during flight).

The AI controller may include modular components including libraries of routines that may be used for piloting a drone. An AI controller may be configured with a standardized set of modules for operation of standardized hardware and different teams may then develop AI code to interact with such standardized components in competition. For example, different AI code may be used in combination with other modules to race drones around a racecourse to compare performance of different AI code. In an example, participating teams may be provided with an AI controller preloaded with certain standardized modules and a workstation providing an Integrated Development Environment (IDE) for developing AI code. A drone simulator may be provided for testing AI code and a debugger may be provided for debugging AI code running on the AI controller while it is coupled to the simulator. An AI controller for use in an autonomous drone may be loaded with AI code, coupled to such a simulator and debugger, and may pilot simulated drones around simulated environments (e.g. simulated racecourses) to debug, test, and teach (e.g. by machine learning) the AI code.

Debugging may include using accurate timestamping (e.g. Precision Time Protocol (PTP)) on both an AI controller and a drone simulator (e.g. quadcopter simulator)

coupled to the AI controller. In case of an error in AI piloting code (or other event), timestamps may be used to rewind the drone simulator to (or past) the point where the error occurred (the error time). A debugger may then step through operations of the drone simulator and the AI piloting code to identify a source of an AI code error. A clock in the AI controller may be synchronized with a clock in a workstation that implements the drone simulator and the debugger so that timestamping is accurate across all hardware (e.g. using PTP hardware timestamps to achieve synchronization accuracy of less than one millisecond)

A drone simulator (e.g. quadcopter simulator) for use with an AI controller may include certain features to facilitate interaction with the AI controller. An AI controller may be more sensitive to small differences between simulated behavior and real behavior than a human pilot. For example, human pilots may compensate for some inaccuracy and may not even notice some discrepancies that may affect AI code. A drone simulator may be used to teach an AI controller (e.g. using machine learning) how to pilot a drone and the accuracy of such a drone simulator may subsequently affect how AI code pilots a real drone so that poor simulation may result in poor piloting (potentially including crashes or other unwanted consequences). In order to provide an accurate simulator, actual drone components may be characterized using bench testing to generate detailed characterization of different component characteristics across their operating ranges (rather than using simplified models that may not be as accurate). The test data can be used to generate detailed lookup tables for various characteristics under various conditions. Testing may be performed for a significant population of components (e.g. quadcopter motors, propellers, batteries, etc.) over different conditions (e.g. different current, power, RPM, battery charge) to obtain averaged data. The lookup tables may be used in a quadcopter simulator to provide extremely accurate simulation of a quadcopter that is suitable for providing to an AI controller.

Simulated sensor output and/or simulated camera output from a drone simulator may be modified to add simulated noise. In some cases, such simulated noise may be at a level that would not be noticed, or would not appear significant to a human pilot but may affect an AI pilot. Suitable simulated noise may be found from bench testing sensors and/or cameras. For example, creating constant conditions, recording sensor/camera output, and subtracting a constant signal to leave a noise component. A statistically significant population of sensors and/or cameras may be tested, and the test results combined (e.g. averaged) to obtain simulated noise that may then be added to simulated sensor output and/or simulated camera output. Such noise-added outputs may be provided to an AI controller and may be used by the AI controller to pilot a simulated drone.

Although the following description is primarily given the context of drones (e.g. quadcopters) moving along a three-dimensional path through a course (e.g. a racecourse where drones compete to go around the racecourse and reach a finish line by selecting the fastest flightpath), certain concepts presented can be applied more generally. For example, the systems and techniques can be applied to non-drone aircraft or other objects that serve as a mobile source of the described signals as it moves along a three-dimensional path.

FIG. 1 is a top view of an example of a course and a drone moving along a path through the course. From the start location, the course passes through the gates G1-G6 111-116 sequentially and then through an end gate EG 117 to arrive at the finish location. The drone 101 is shown moving along the path through the series of gates. A set of control transceivers cTx1-4 151-154 cover the region that includes the course to supply control signals to drones on the course and also receive data back from the drones so that users, using remote-controls, may fly their drones and may see video from a camera on their drone (FPV). Although the start and finish of the course shown FIG. 1A are shown as near each other, this need not be so in general. Similarly, although the course is shown defined by a series of frame-like gates, pylons or other structures can be used to specify a course or path. While drone racing provides one area in which the present technology may be used, the present technology is not limited to racing and may be used to operate a variety of drones and other autonomous craft in a variety of environments.

Figure 2:
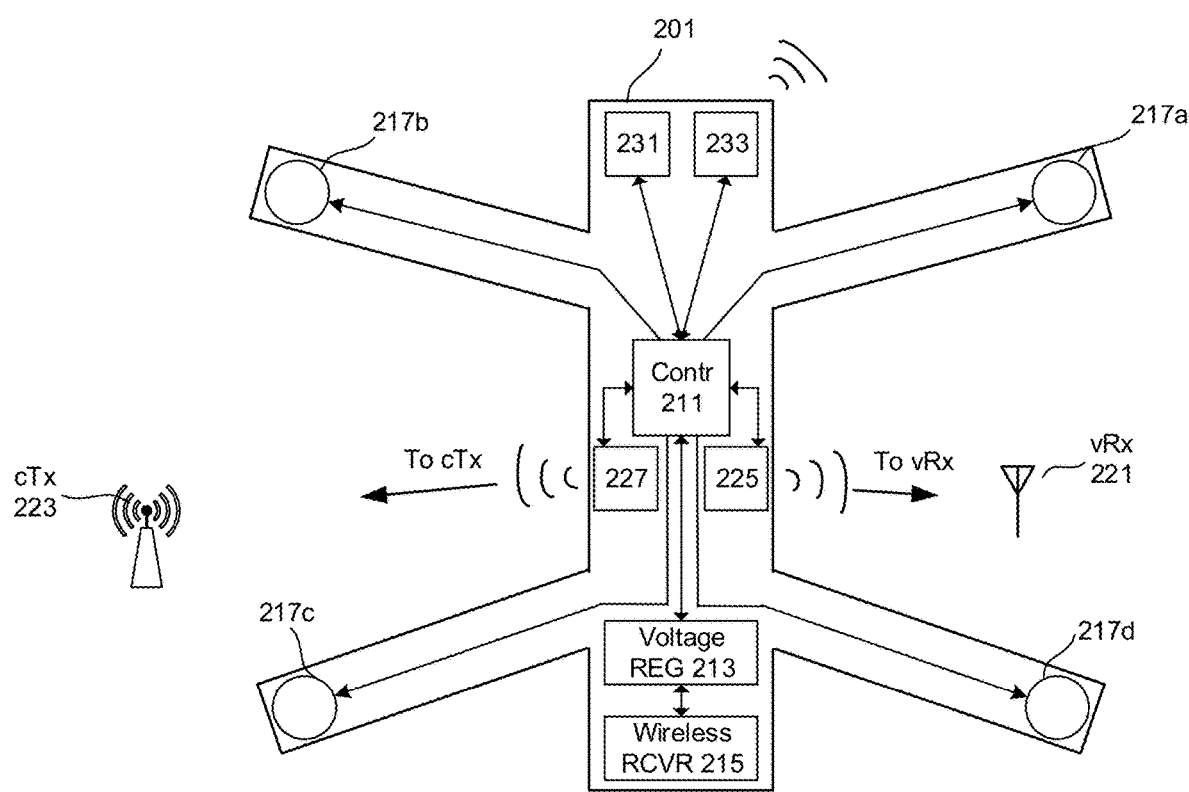
FIG. 2 is simplified representation of some of the components for one embodiment of a quadcopter.

FIG. 2 is simplified representation of some of the components for one example of a drone 201, which is a remote-controlled quadcopter in this example. FIG. 2 shows flight controller 211 connected to motors 217*a-d* (which turn respective propellers, not shown in this view), the voltage source and regulator 213, wireless receiver 215, video camera 231 and altitude sensor 233, and the transmitters 225 and 227. In this embodiment, extending on an arm from each of the corners of the drone is a motor 217*a-d*, each of which is controlled by the flight controller 211 to thereby control thrust generated by propellers attached to motors 217*a-d*. A voltage source (e.g. battery) and regulator 213 supplies power. A pilot's commands are transmitted from control signal transceivers such as cTx 223, received by wireless receiver 215. Control signal transceiver cTx 223 may be in a remote-control operated by a pilot (remote-control user) to fly drone 201 The flight controller 211 uses power from the voltage source 213 to drive the motors 217*a-d* according to the pilot's signals.

The drone also includes video camera 231 and altitude sensor 233 that supply data to the flight controller 211. An FM or other type video transmitter 225 transmits data from the video camera 231 to a video monitor receiver vRx 221 (external to the drone, such as on the ground) that monitors the video signals and passes on the video data to the pilot. Data can also be sent back to the control signal transceiver cTx 223 by the transmitter 227. Although the transmitter 227 and wireless receiver 215 are shown as separate elements in FIG. 2, in many embodiments these will be part of a single transceiver module (e.g. a remote-control may include both a control signal transceiver and a video monitor receiver to allow a remote-control user to see video from video camera 231 while piloting drone 201).

Figure 3:
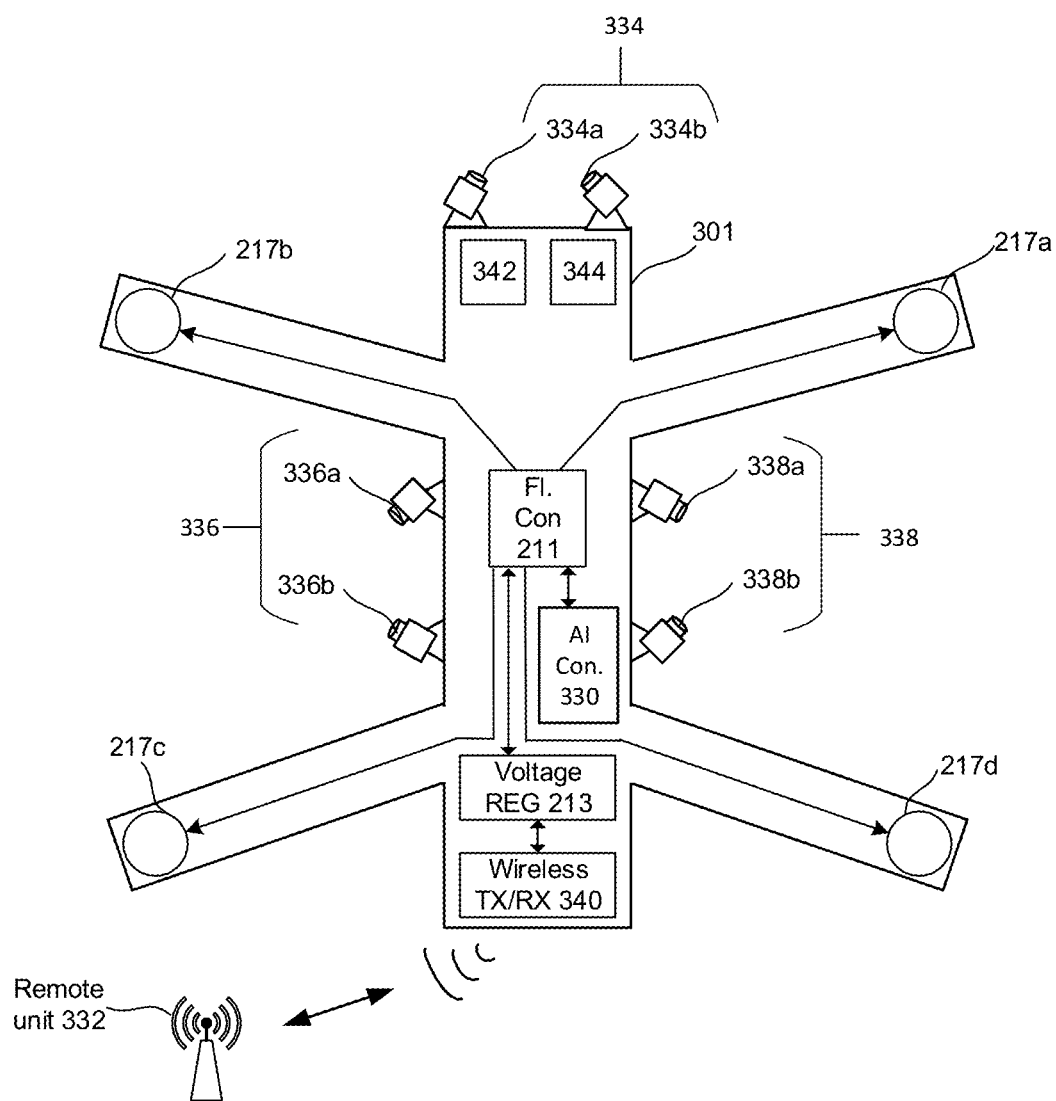
FIG. 3 shows an example of an autonomous quadcopter.

FIG. 3 shows an example of an autonomous drone 301 (autonomous quadcopter in this example), which is different to drone 201 in that it is configured for autonomous operation, instead of, or in addition to receiving commands from a remote user. For example, autonomous drone 301 may fly around a course such as illustrated in FIG. 1, maneuvering through gates, around obstacles, etc. without commands from a remote user. Instead of receiving commands via RF communication from a remote-control, when in autonomous mode, autonomous drone 301 may operate according to commands generated by an Artificial Intelligence (AI) controller 330, which is coupled to the flight controller 211 (components of autonomous drone 301 that are common to drone 201 are similarly labeled). In this arrangement, AI controller 330 selects a flightpath and generates commands according to the same command set used by a remote-control. Thus, remote unit 332 may send commands to flight controller 211 according to a predetermined command set when autonomous drone 301 is in a remote-control mode. AI controller 330 may send commands to flight controller 211 according to the same predetermined command set when autonomous drone 301 is in an autonomous mode. In this way, flight controller 211 may operate similarly in both remote-control mode and autonomous modes and does not require reconfiguration. This allows drones developed for remote-control to be easily adapted for autonomous operation, thus taking advantage of preexisting components and shortening development time for autonomous quadcopter development.

In an example, AI controller 330 may be implemented in an AI module that may be considered as a bolt-on component that may be added to a fully-functional drone (e.g. instead of, or in addition to a remote-control). For example, AI controller 330 may be implemented by a controller module, such as an NVIDIA Jetson AGX Xavier module, which includes a Central Processing Unit (CPU), Graphics Processing Unit (GPU), memory (e.g. volatile memory such as DRAM or SRAM), data storage (e.g. non-volatile data storage such as flash), and Vision accelerator. Other suitable controller hardware may also be used. The AI controller 330 may be connected to flight controller 211 and other quadcopter components through a physical connector to allow it to be connected/disconnected for configuration for AI control/remote-control. AI controller 330 may be physically attached to autonomous drone 301 by being clipped on, bolted on, or otherwise attached (e.g. to the chassis of drone 301) in a manner that makes physical removal easy.

While a human pilot may fly a drone based on video sent to the pilot from the drone, an AI pilot, such as embodied in AI controller 330 may pilot a drone based on different input including sensor input and/or input from multiple cameras (e.g. using Computer Vision (CV) to identify and locate features in its environment). While human pilots generally rely on a single camera to provide a single view (first person view, or "FPV"), an AI pilot may use a plurality of cameras that cover different areas (e.g. a wider field of view, more than 180 degrees and as much as 360 degrees). In an example, cameras may be arranged in pairs, with a pair of cameras having overlapping fields of view. This allows such a pair of cameras to form a stereoscopic camera so that depth of field information may be extracted by a CV unit. FIG. 3 illustrates an example of camera 334*a* and camera 334*b*, which are arranged with overlapping fields of view to form a stereoscopic camera 334. Similarly, cameras 336*a* and 336*b* form stereoscopic camera 336 and cameras 338*a* and 338*b* form stereoscopic camera 338. It will be understood that the orientations (different angles corresponding to different views) and locations of cameras shown in FIG. 3 are illustrative and that the number, location, arrangement, and pairing of such cameras may be varied according to requirements (e.g. more than three stereoscopic cameras may be used). In the example of FIG. 3, video outputs of all cameras, 334*a*, 334*b*, 336*a*, 336*b*, 338*a*, and 338*b* (and any other cameras) are sent to AI controller 330. While one or more video output may be transmitted to an external location (e.g. transmitted by transmitter/receiver 340 to remote unit 332), in some cases no such transmission is performed when autonomous drone 301 is in autonomous mode. In some cases, an autonomous drone such as autonomous drone 301 is configurable to receive commands from a remote-control such as remote unit 332 (e.g. may be remote-controlled at certain times, e.g. according to selection by a remote user) through a communication circuit. These commands may use the same command set so that commands from AI controller 330 and remote unit 332 are interchangeable. Transmitter/receiver 340 may be considered an example of a Radio Frequency (RF) communication circuit coupled to the flight controller 211, the RF communication circuit (e.g. RF receiver) is configured to receive external commands from a remote-control (e.g. remote unit 332) and provide the external commands to the flight controller 211 to direct the flight controller to follow a remotely-selected flightpath, the external commands and the commands provided by the AI controller 330 from a common command set.

AI controller 330 includes computer vision (CV) capability to interpret input from cameras 334*a*, 334*b*, 336*a*, 336*b*, 338*a*, and 338*b* to gain information about the environment around drone 301 (e.g. object identification and location). Stereoscopic cameras 334, 336, 338 are configured to obtain different stereoscopic views to allow depth of field analysis so that the proximity of objects (including racecourse features such as gates, drones, and other racecourse features) may be accurately determined. AI controller 330 may use CV capability to generate a three-dimensional (3-D) picture of the surrounding of autonomous drone 301, or a portion of the surroundings (e.g. generally ahead of autonomous drone 301 along its direction of travel). In some cases, multiple cameras may be used to collectively provide a full 360-degree field of view. In other cases, cameras may cover less than 360 degrees but may still collectively cover a larger field of view than a human pilot could effectively monitor. Video output from cameras 334*a*, 334*b*, 336*a*, 336*b*, 338*a*, and 338*b* may be directly provided to AI controller 330 without conversion to RF and transmission as used by remote-controlled drones (e.g. remote-controlled quadcopters). This may allow rapid reaction as drone 301 moves and video output reflects changing surroundings (e.g. reduced latency may allow faster response than with remote-control).

AI controller 330 is coupled to the plurality of cameras 334*a*, 334*b*, 336*a*, 336*b*, 338*a*, and 338*b* to receive input from the plurality of cameras, determine a flightpath for the autonomous quadcopter (e.g. drone 301) according to the input from the plurality of cameras, and provide commands to the flight controller 211 to direct the flight controller 211 to follow the flightpath. Thus, the role of flight controller 211 is to execute commands from AI controller 330 (as it would from a remote-control user), while AI controller makes piloting decisions based on video input (and, in some cases, other input, e.g. from sensors). AI controller 330 may be considered an example of an Artificial Intelligence (AI) controller coupled to a plurality of cameras (e.g. cameras 334, 336, 338) to receive input from the plurality of cameras, determine a flightpath for the autonomous quadcopter 301 according to the input from the plurality of cameras, and provide commands to the flight controller 211 to direct the flight controller to follow the flightpath. Flight controller 211 is coupled to the four motors 217*a-d* to provide input to the four motors to control flight of the autonomous quadcopter 301.

In addition to cameras 334*a*, 334*b*, 336*a*, 336*b*, 338*a*, and 338*b*, autonomous drone 301 includes Inertial Measurement Unit (IMU) sensors 342 and rangefinder 344. IMU sensors 342 may measure one or more of specific force, angular rate, and magnetic field using a combination of accelerometers (acceleration sensors), gyroscopes (gyroscopic sensors), and magnetometers to generate motion data (e.g. autonomous quadcopter motion data). For example, IMU sensors 342 may be used as a gyroscope and accelerometer to obtain orientation and acceleration measurements. Rangefinder 344 (which may be considered a distance or range sensor) measures the distance from autonomous drone 301 to an external feature (e.g. the ground, obstacle or gate along a racecourse, etc.) Rangefinder 344 may use a laser to determine distance (e.g. pulsed laser, or Light Detection and Ranging "LiDAR"). Outputs from sensors 342 and 344 are provided to AI controller 330 in this example. Outputs from such sensors may also be provided to a flight controller (e.g. flight controller 211) in some cases. In addition to the sensors illustrated, an autonomous drone may include other sensors such as a barometer, or altimeter, to determine height of a drone above ground, and/or LIDAR sensors using lasers to generate 3-D representations of surroundings. In some cases, a Global Positioning System (GPS) module may be provided to provide position information based on communication with GPS satellites.

AI controller 330 may be in the form of a removable module that is added to a drone to provide capacity for autonomous operation. Within AI controller 330, certain modules may be provided with different functions. In an example, different AI technologies may be compared side-by-side by loading AI controllers with different AI code and flying drones using the different AI code (e.g. in a race) to compare AI technologies. In such an example, certain basic functions of AI controller 330 may be provided by standard modules that are common to multiple AI controllers while other functions may be customized by a particular module, or modules, that are then compared by flying drones with identical drone hardware, AI controller hardware, and some identical modules within AI controllers provide a comparison of AI technologies without effects of different hardware and/or software differences unrelated to AI piloting. According to an example, autonomous drone racing uses different AI technologies in identical autonomous drones. This eliminates hardware differences. Certain common software may be provided in standard AI controllers to provide a common platform (common hardware and software elements) that accommodates different AI technologies and allows them to compete on an equal footing. This provides development teams with an opportunity to focus on core technology, reduces cost, and reduces development time. Racing drones around complex courses provides comparison between different candidate AI technologies and can identify winning candidates for further development. This provides valuable information, reduces wasted resources on unpromising technologies, and rapid identification of winning technologies reduces overall development time and cost.

Figure 4:
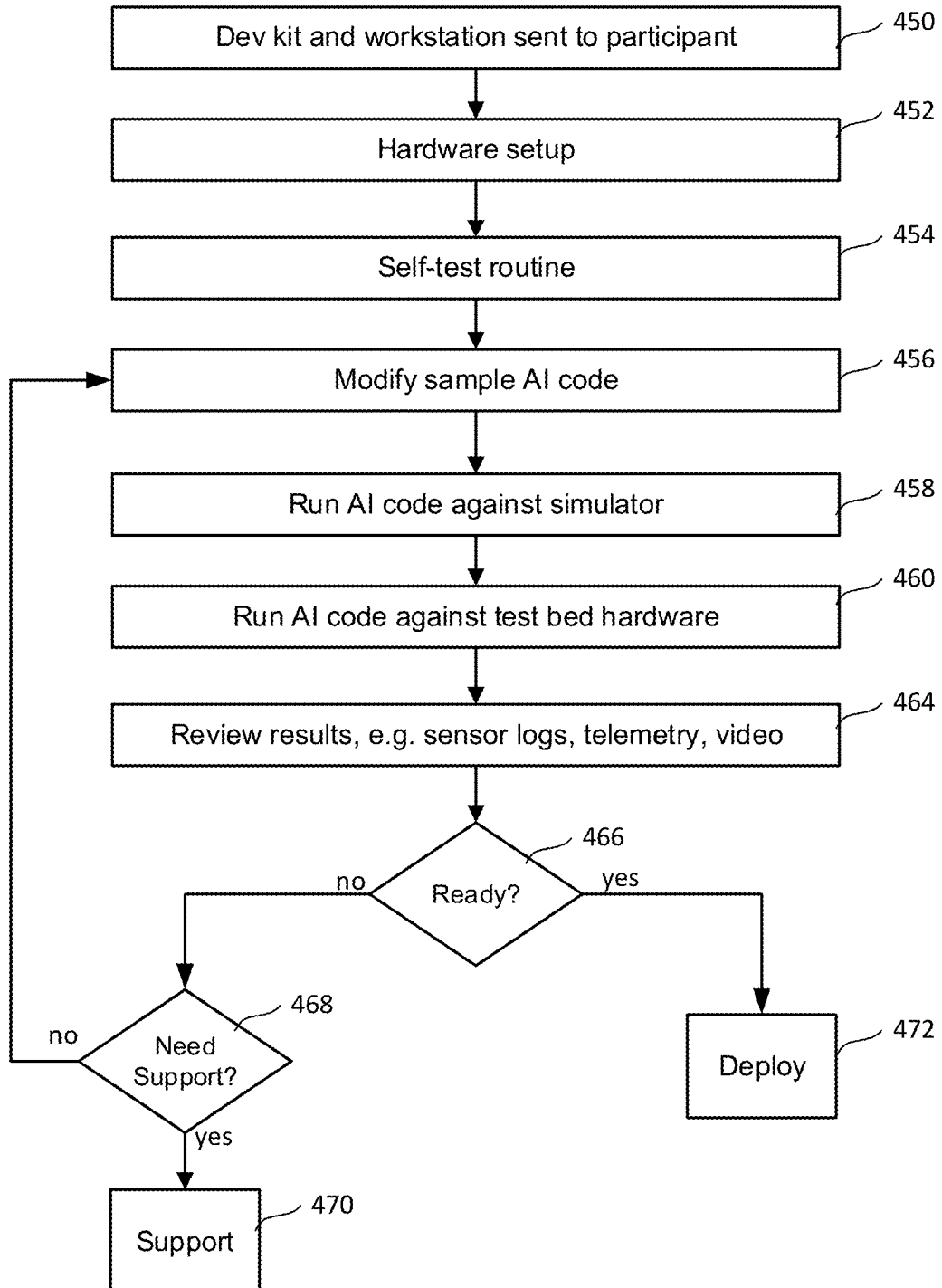
FIG. 4 shows an example of a method of developing AI code.

FIG. 4 illustrates an example of a method of developing AI technology which may be used in an autonomous drone, e.g. used in AI controller 330 of autonomous drone 301. The method of FIG. 3 generates AI code in multiple iterations, with testing of AI code using a simulator (e.g. quadcopter simulator) to test AI code at each iteration. The simulator may be implemented using a workstation that is coupled to an AI controller. The simulator may have some features in common with drone simulators used by human pilots. However, differences between human controlled flight (through remote-control) and autonomous flight may result in important differences in such simulators and in how they are coupled to pilots.

The method of FIG. 4 may be used by multiple teams of AI developers (participants) to develop AI code for flying autonomous drones (e.g. to develop AI code for AI controller 330). Development of AI code in FIG. 4 occurs without the use of actual drones so that, in the case of any failure (e.g. crash, collision, etc.), no hardware is destroyed so that development costs are not impacted by hardware repair and replacement. Only after the AI code is tested against a simulator is it deployed for use to fly drones. In some cases, simulation may include some hardware elements (Hardware-in-the-loop, or HITL testing). However, this generally occurs on a testbench or other test environment where a limited number of components (e.g. cameras, sensors, etc.) may be tested without actually flying a drone. Thus, destruction of hardware components during development is generally avoided or reduced.

In the method of FIG. 4, a software development kit (SDK), or "Dev kit" and workstation are sent to a participant 450 (e.g. to each participant of a group of participants). The SDK may include software components to facilitate generating AI code. Sample projects may be provided for participants to check and become familiar with the system. The SDK may be implemented using an AI controller (e.g. AI controller 330) that may be sent with the SDK and may be preloaded with appropriate software modules. The participant then performs hardware setup 452, for example, coupling the AI controller to a workstation and connecting any hardware components. A self-test routine 454 may be performed to check for hardware problems (e.g. ensure coupling between workstation and AI controller). A sample AI code module may be provided as part of the SDK. A participant may modify sample AI code 456 in order to improve the sample code, e.g. by adding additional AI code to the sample AI code according to the participant's technology. The AI code may be written and debugged using an Integrated Development Environment (IDE) that is provided to the participant. This may be a customized IDE based on an available IDE such as the Eclipse IDE from the Eclipse Foundation. The participant may then run the AI code against the simulator 458. For example, AI code developed by the participant may be loaded into the AI controller, which is coupled to a workstation that includes drone simulation software. The AI controller may interact with the simulator to simulate flying of a drone. Subsequently, a participant may run the AI code against test bed hardware 460. For example, a test bed may include components such as cameras, sensors, batteries, motors, so that the AI code can be verified with some hardware components in addition to a simulator. A participant may then review results, e.g. sensor logs, telemetry, video 464 to evaluate the performance of the AI code. Based on this review, a determination may be made as to whether the AI code is ready 466, e.g. ready to deploy to an actual drone. In general, multiple iterations may be required to produce AI code that is ready to deploy. When a determination is made that the AI code is not ready, a determination is made as to whether support is needed 468. For example, the results of running AI code against the simulator and/or hardware may indicate a problem that requires help from the SDK provider and/or hardware provider or other entity. If such support is indicated, then the participant may contact support 470. If no such support is indicated, then the participant may further modify sample AI code 456 and commence another iteration of modification and testing. When the participant generates AI code that is determined to be ready 466, this AI code may be deployed 472, e.g. by loading it in an AI controller of an actual drone and using it to autonomously pilot the drone (e.g. racing a real quadcopter, under control of the AI controller, around a racecourse). By running AI code to fly a simulator over multiple iterations in this way, the risk of crashing an actual drone is reduced and thus costs are reduced. Different AI code versions of AI piloting code may be generated in different iterations and compared to select an AI code version for deployment (e.g. according to the fastest time piloting a simulated quadcopter around a simulated quadcopter racecourse).

Figure 5:
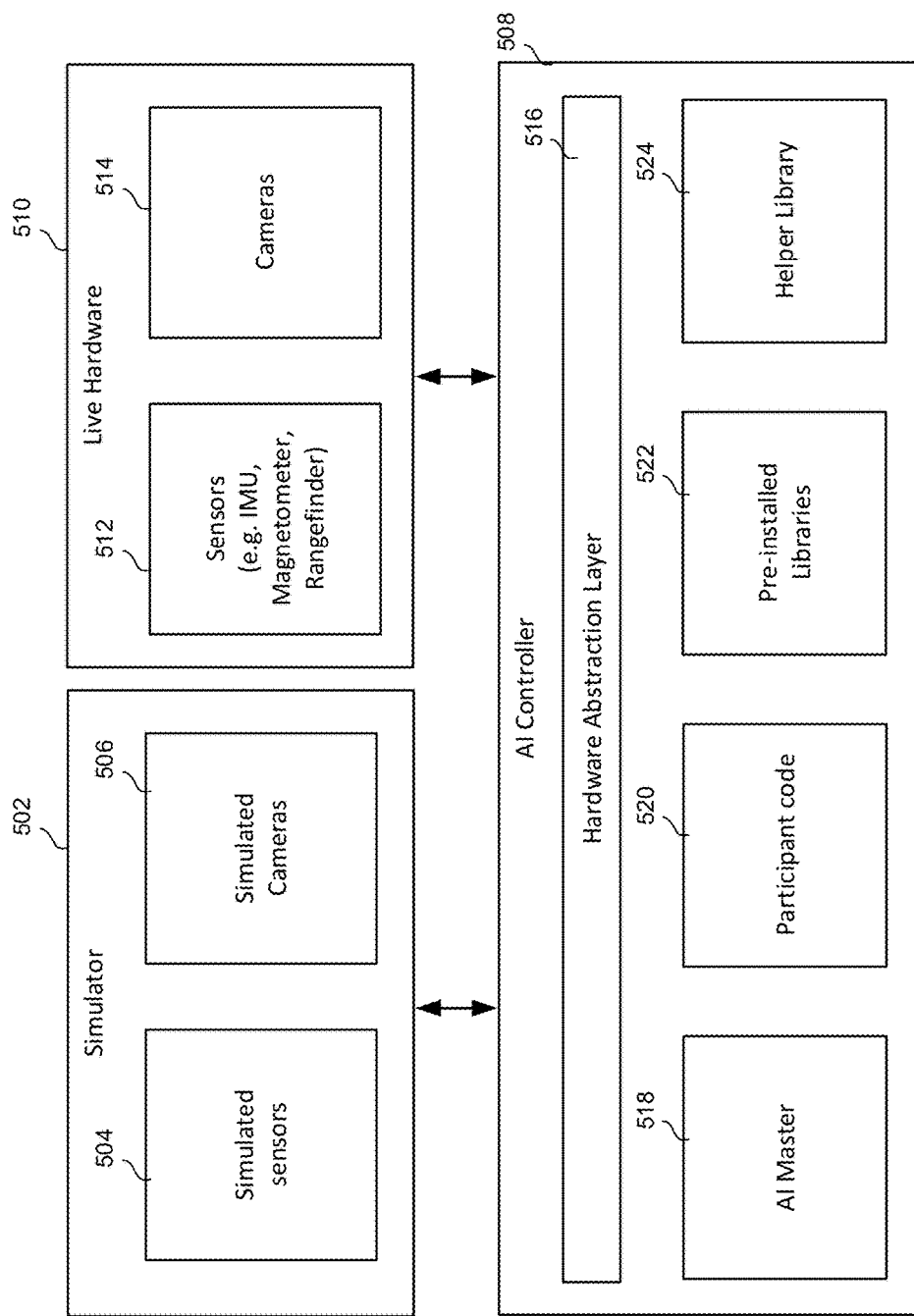
FIG. 5 shows an example of components of an AI controller coupled to a simulator.

Some of the hardware and software components used in the process of FIG. 4 are illustrated in FIG. 5. For example, a simulator 502 is shown that includes simulated sensors 504 (e.g. simulated accelerometer, simulated gyroscope, simulated rangefinder, etc.) and simulated cameras 506. Simulator 502 may be implemented on a workstation that is configured by simulator software to simulate a drone such as a quadcopter. The features of simulator 502 may be customized according to the drone to be simulated and its hardware components. Thus, simulated sensors 504 may provide simulation of any sensors to be included in an actual drone. These may include one or more IMU sensors, rangefinder sensors, LIDAR sensors, altimeter sensors and/or other sensors. Output from simulated sensors 504 may be sent in a format that conforms to a standard suitable for sensor output. For example, simulated sensor output may be sent in User Datagram Protocol (UDP) format, or other format that may be used by actual sensors of a drone.

Simulated cameras 506 may generate simulated views from multiple cameras of a simulated drone. In general, simulation is adapted to the hardware to be simulated so that for simulation of a quadcopter with six cameras arranged as three stereoscopic cameras (e.g. stereoscopic cameras 334, 336, 338 of quadcopter 301) simulated cameras 506 produce six simulated camera outputs. These outputs may be provided in any suitable format. For example, where simulator 502 is implemented as a workstation, High-Definition Multimedia Interface (HDMI) ports may be provided and camera outputs may be sent in HDMI format through such HDMI ports. AI controller 508 also generates inputs to simulator 502, including commands to simulator 502 that correspond to changes in drone orientation and/or direction.

FIG. 5 also shows live hardware 510, which includes sensors 512 (e.g. one or more IMU, magnetometer, rangefinder, lidar, altimeter, and/or other sensor(s)) and cameras 514 (e.g. multiple cameras forming one or more stereoscopic cameras. Live hardware 510 may include additional drone hardware components such as motors, batteries, power controllers, etc. Live hardware 510 may be used in conjunction with simulator 502 to test AI controller 508 and, for example, to test AI code (e.g. participant code 520) operating on controller 508. Live hardware 510 may be operated on a test bench with individual components operated separately, or in combination. In some cases, a complete drone may be provided as live hardware. AI code operating on AI controller 508 may be run against simulator 502 (as shown at step 458 of FIG. 4) and subsequently run against live hardware 510 (as shown at step 460 of FIG. 4). Simulator 502 and live hardware 510 may be interchangeable (e.g. using the same connectors) so that simulator 502 may be disconnected from AI controller 508 prior to connecting live hardware 510.

FIG. 5 illustrates modules of AI controller 508 including hardware abstraction layer 516 which abstracts input from simulator 502 and live hardware 510 so that the input is available to other components of AI controller 508 in abstracted form and other components do not have to perform conversion. For example, hardware abstraction layer 516 may receive interleaved camera output (e.g. alternating frames, or interleaved line-by-line, or otherwise interleaved) from a plurality of cameras (simulated cameras 506 and/or cameras 514), deinterleave the input to regenerate frames from individual cameras, and separately buffer the frames for different cameras (e.g. buffered in ROM) so that a sequence of frames for a given camera may be provided at the correct frame rate (e.g. a predetermined frame rate such as 60 Hz) to components of AI controller 508 that may require video input. In an example, video output from two cameras or simulated cameras (e.g. a pair of cameras forming a stereoscopic camera) that are interleaved may be deinterleaved, buffered, and made available to modules such as a CV module that may then use the video. Hardware abstraction layer 516 may abstract sensor input (from simulated or real sensors) and buffer sensor data received at speed so that it is presented at the correct frame rate (e.g. by mapping kernel memory to user memory).

AI controller 508 includes different modules to perform different functions. An AI master 518 is responsible for running AI code including routines from other components. AI master 518 may also interact with simulator 502, with a debugger, and may perform other functions that are not directly involved with piloting a drone. Participant code 520 is code written or modified by participants. While other components shown in FIG. 5 may be common to all participants, each participant may create their own participant code. FIG. 4 showed a method for development of participant code, such as participant code 520, through modification of participant code (sample AI code) in multiple iterations while other modules remain unchanged from iteration to iteration. AI controller 508 includes pre-installed libraries 522 and a helper library 524. These libraries may include various libraries of software routines that may be available for operation of a drone. For example, pre-installed libraries 522 may include various publicly available libraries that participant code may use while helper library 524 may include routines that are customized for drone operation and may be provided by as part of an SDK to make development of participant code simpler and quicker.

Figure 6A:
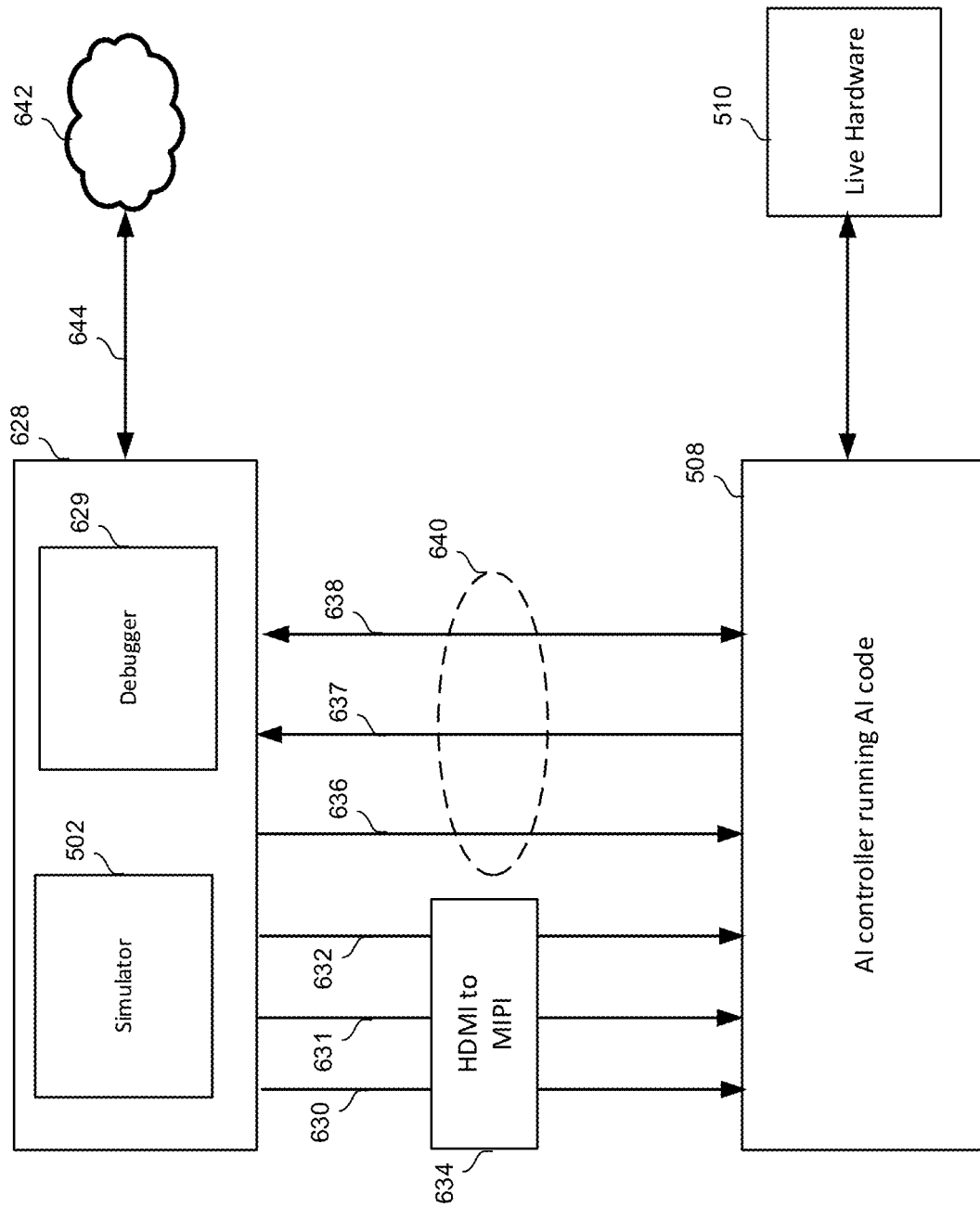
FIG. 6A shows an example of an AI controller running AI piloting code coupled to a workstation implementing a quadcopter simulator.

FIG. 6A illustrates an example of physical connections between components of FIG. 5, including coupling of simulator 502 (running on workstation 628) to AI controller 508. The arrangement of FIG. 6A may be used to implement the method illustrated in FIG. 4. Simulator 502 generates six simulated camera outputs that form three simulated stereoscopic camera outputs by pairing simulated camera outputs from simulated cameras that have overlapping fields of view. Outputs from a pair of cameras may be sent over an HDMI connection in an interleaved format or combined in another way. For example, two or more lower-resolution frames may be combined in a single frame, e.g. two frames of simulated camera output with 1280×720 pixels may be combined in a single frame of 1920×1200 pixels. FIG. 6A shows three HDMI cables 630, 631, 632 from workstation 628. Each HDMI cable 630, 631, 632 may be connected to a corresponding HDMI port of workstation 628 and may carry interleaved output of two simulated cameras that form a simulated stereoscopic camera. HDMI cables 630, 631, 632 are connected to HDMI to MIPI bridge 634, which converts from HDMI format to MIPI CSI (Mobile Industry Processor Interface Camera Serial Interface, e.g. CSI-2 or CSI-3) format (and may also be referred to as an HDMI to MIPI converter). The interleaved MIPI output of HDMI to MIPI bridge 634 may be deinterleaved by a hardware abstraction layer in AI controller 508 (e.g. by HAL 516). While FIG. 6A shows HDMI to MIPI bridge 634 as a single entity, this may be implemented by any suitable hardware. For example, three separate bridges may be used to form HDMI to MIPI bridge 634, with each such bridge converting one HDMI output to a corresponding MIPI output.

In addition to HDMI and MIPI cables to carry camera data from simulator 502 in workstation 628 to AI controller 508, FIG. 6A shows a coupling 636 to carry simulated sensor data from simulator 502 to AI controller 508. Simulated sensor data may be sent over coupling 636 in the form of UDP packets to provide simple low-latency communication suitable for sensor data. Simulated sensor data may be packetized in UDP packets, which are time stamped, and have redundancy code added (e.g. calculation and addition of a Cyclic Redundancy Code such as CRC16) and streamed to AI controller 508. FIG. 6A also shows coupling 637 to carry commands from AI controller 508 to simulator 502. For example, such commands may use a command set that is suitable for drone operation, such as a command set that may be used for remote-control of a drone, e.g. a command set according to the MAVLink protocol, or a MAVLink-like command set. FIG. 6A also shows coupling 638, which is configured to convey logging, debugging, and control data between AI controller 508 and workstation 628 where a debugger 629 may perform debugging of AI code operation in AI Controller 508 as AI Controller 508 pilots a simulated drone of simulator 502. Logging data may include logs of commands and variables that may be sent from AI controller 508 to debugger 629. Debugging data may include data regarding the state of AI controller 508 at a breakpoint (e.g. variable values), timing information, and other data that may be useful to debugger 629. Control data may include commands from debugger to AI code and/or debug-related code operating on AI controller 508. Coupling 637 to carry commands and coupling 638 to carry logging, debugging, and control data may be implemented using Transfer Control Protocol (TCP), which is a connection-oriented protocol to ensure that a connection is established, and that commands and other communication are received. While couplings 636, 637, 638 may be implemented in any suitable manner, in the present example these couplings are implemented through an Ethernet connection 640 so that a single physical connection may be used for these different purposes. Simulator 502 may include an Ethernet port that is dedicated to communication with AI controller 508 for this purpose.

Simulator 502 is also connected to network 642 by coupling 644. For example, coupling 644 may be an Ethernet connection and network 642 may be an intranet or the Internet. Thus, simulator 502 may include an Ethernet port for communication with external entities in addition to an Ethernet port dedicated to communication with AI controller 508. In order to avoid conflicts, a dedicated IP address range may be reserved for communication between simulator 502 and AI controller 508. For example, the IP address range 100.64.0.0/16, which is within a private IP address range may be used so that no conflict occurs. Simulator 502 may be assigned IP address 100.64.0.1 and AI controller may be assigned IP address 100.64.1.1.

FIG. 6A may be considered an example of a quadcopter simulator 502 configured to receive quadcopter flight control commands and to generate simulated sensor output and simulated camera output for a plurality of stereoscopic cameras of a simulated quadcopter, and an Artificial Intelligence (AI) controller 508 coupled to the quadcopter simulator, the AI controller configured to receive the simulated sensor output and the simulated camera output for the plurality of stereoscopic cameras from the quadcopter simulator, determine a flightpath for the simulated quadcopter according to the simulated sensor output and the simulated camera output, generate the quadcopter flight control commands according to the flightpath, and provide the quadcopter flight control commands to the quadcopter simulator.

Figure 6B:
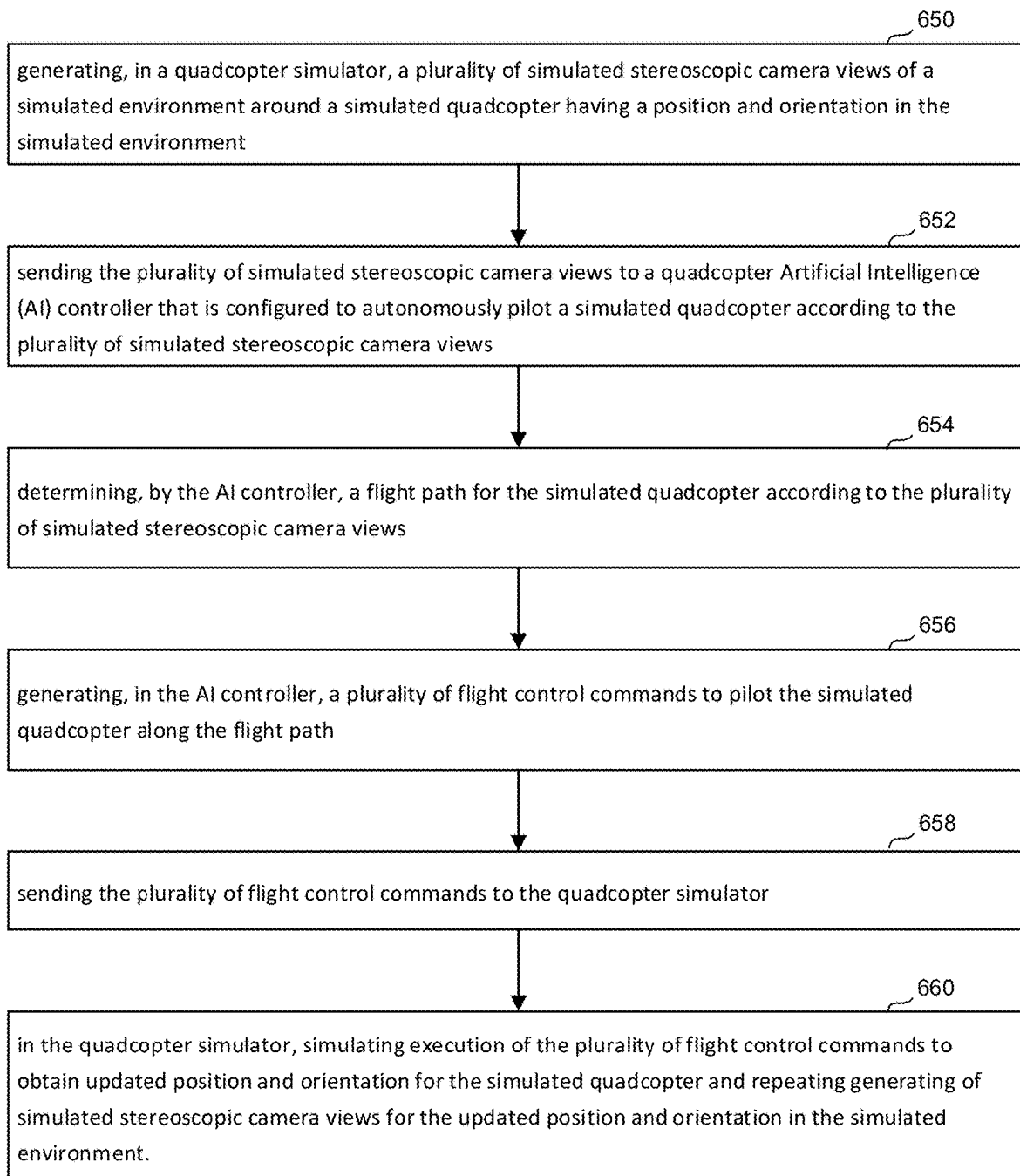
FIG. 6B shows an example of a method operating an AI controller and quadcopter simulator.

FIG. 6B shows an example of a method that includes generating, in a quadcopter simulator, a plurality of simulated stereoscopic camera views (with different orientations) of a simulated environment around a simulated quadcopter having a position and orientation in the simulated environment 650, sending the plurality of simulated stereoscopic camera views to a quadcopter Artificial Intelligence (AI) controller that is configured to autonomously pilot a simulated quadcopter according to the plurality of simulated stereoscopic camera views 652, determining, by the AI controller, a flight path for the simulated quadcopter according to the plurality of simulated stereoscopic camera views 654, and generating, in the AI controller, a plurality of flight control commands to pilot the simulated quadcopter along the flight path 656. The method further includes sending the plurality of flight control commands to the quadcopter simulator 658 and in the quadcopter simulator, simulating execution of the plurality of flight control commands to obtain updated position and orientation for the simulated quadcopter and repeating generating of simulated stereoscopic camera views for the updated position and orientation in the simulated environment 660.

Figure 7:
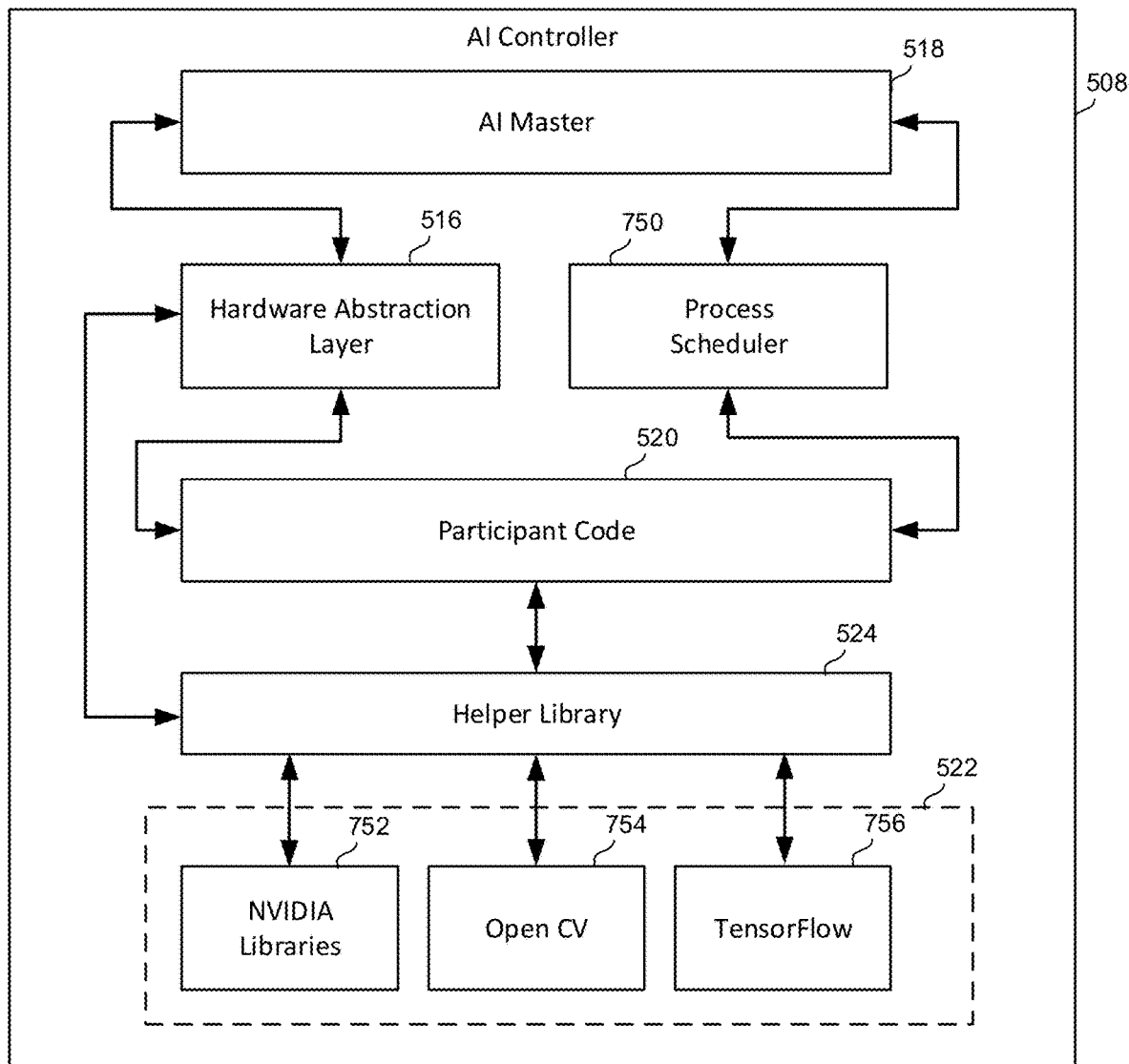
FIG. 7 shows an example of AI controller operation.

FIG. 7 illustrates operation of components of AI controller 508 shown in FIG. 5 when coupled to a simulator to pilot a simulated drone as shown in FIG. 6, or when piloting an actual drone (e.g. when AI controller 508 is coupled to a flight controller of a drone such as flight controller 211 of drone 301). AI controller 508 may be a suitable controller such as the NVIDIA Jetson AGX Xavier, which includes CPU cores, GPU cores, deep learning accelerators (DLAs), and a programmable vision accelerator (PVA) suitable for computer vision applications (e.g. may form a computer vision unit) and machine learning. AI master 518 handles out of band communication with the IDE, e.g. communication with debugger 629 operating on workstation 628 and AI master 518 runs loops for hardware abstraction layer 516 and participant code 520.

Data flows into hardware abstraction layer 516 (HAL) from either actual sensors (on a drone or test bench) or from a simulator such as simulator 502 (over UDP). The HAL 516 provides a common interface for the user code across any implementation (e.g. with a simulator such as simulator 502, with hardware components provided with the development kit or other test bench hardware, and with hardware of an actual drone) by abstracting sensor data (e.g. gyroscope, accelerometer, magnetometer, rangefinder) into abstract base classes. HAL 516 also abstracts camera feeds to generate abstracted input for computer vision. Participant code 520 reaches into HAL 516 for all communications, including incoming communications from sensors and cameras and outgoing communications to a flight controller. Communication from participant code 520 to drone hardware (and simulated hardware) passes through HAL 516 so that participant code 520 can provide commands at a high level and HAL 516 then converts these commands to lower-level commands, e.g. providing commands to a flight controller in terms of thrust, pitch, roll, and yaw according to a command protocol such as MAVLink-like protocol, or other such protocol.

Participant code 520 uses process scheduler 750 to run in either fixed frequency loops, with data synchronized, or can be scheduled to run a callback at an arbitrary time. Participant code 520 may call routines from helper library 524, which may call (or include) routines from pre-installed libraries 522, including NVIDIA libraries 752 (e.g. VisionWorks, CUDA, CUDA Deep Neural Network library (cuDNN)), OpenCV libraries 754 (e.g. CUDA accelerated), and TensorFlow libraries 756. Participant code 520 may also directly call routines from pre-installed libraries 522. Helper library 524 has a common interface across all platforms (e.g. simulator, test bench hardware, actual drone hardware) and may include a light wrapper for some common computer vision tasks, algorithms, and data structures, as well as control of the drone, which goes through HAL 516.

Figure 8:
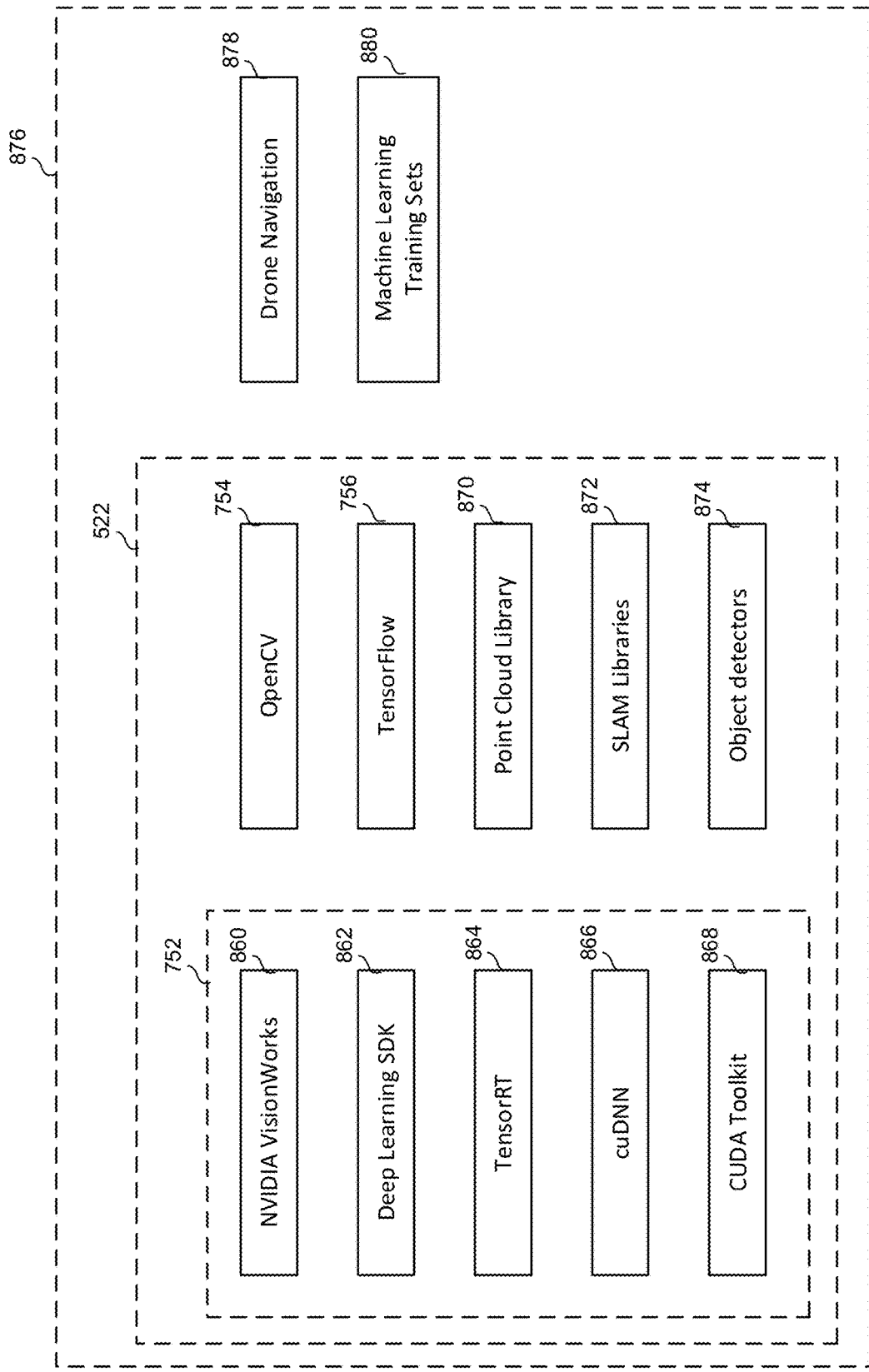
FIG. 8 shows some components of an example Software Development Kit (SDK).

Further details of software components that may be included in pre-installed libraries 522 are illustrated in FIG. 8. FIG. 8 shows NVIDIA libraries 752 including NVIDIA VisionWorks 860 (a software development package for computer vision and image processing, which may form part of a computer vision unit), Deep Learning SDK 862 (tools and libraries for designing GPU-accelerated deep learning applications), TensorRT 864 (a platform for deep-learning inference), cuDNN 866 (a GPU-accelerated library of primitives for deep neural networks), and CUDA toolkit 868 (a development environment for creating high-performance GPU-accelerated applications). FIG. 8 also shows OpenCV 754 (an open source computer vision library, which may be considered a CV unit, or part of a CV unit), TensorFlow 756 (an open source software library for high performance machine learning and numerical computation), Point Cloud Library 870 (an open-source library of algorithms for point cloud processing tasks and 3D geometry processing, e.g. for 3D computer vision), SLAM libraries 872 (libraries related to Simultaneous Localization And Mapping, or "SLAM" e.g. ORB-SLAM2, YOLO, etc.), Object detectors 874 (this may include elements in addition to object detection elements in OpenCV 754 and TensorFlow 756 libraries). In addition to pre-installed libraries 522, an SDK 876 that is provided to participants may include drone navigation Application Programming Interface (API) 878 to facilitate development of participant code and machine learning training sets 880 that may include training sets that are specific to features to be encountered by drones (e.g. racecourse components such as gates, obstacles, and other drones for racing drones). These may be used by machine learning code (e.g. in participant code 520) so that such code learns at least some basic piloting from such training sets.

Figure 9:
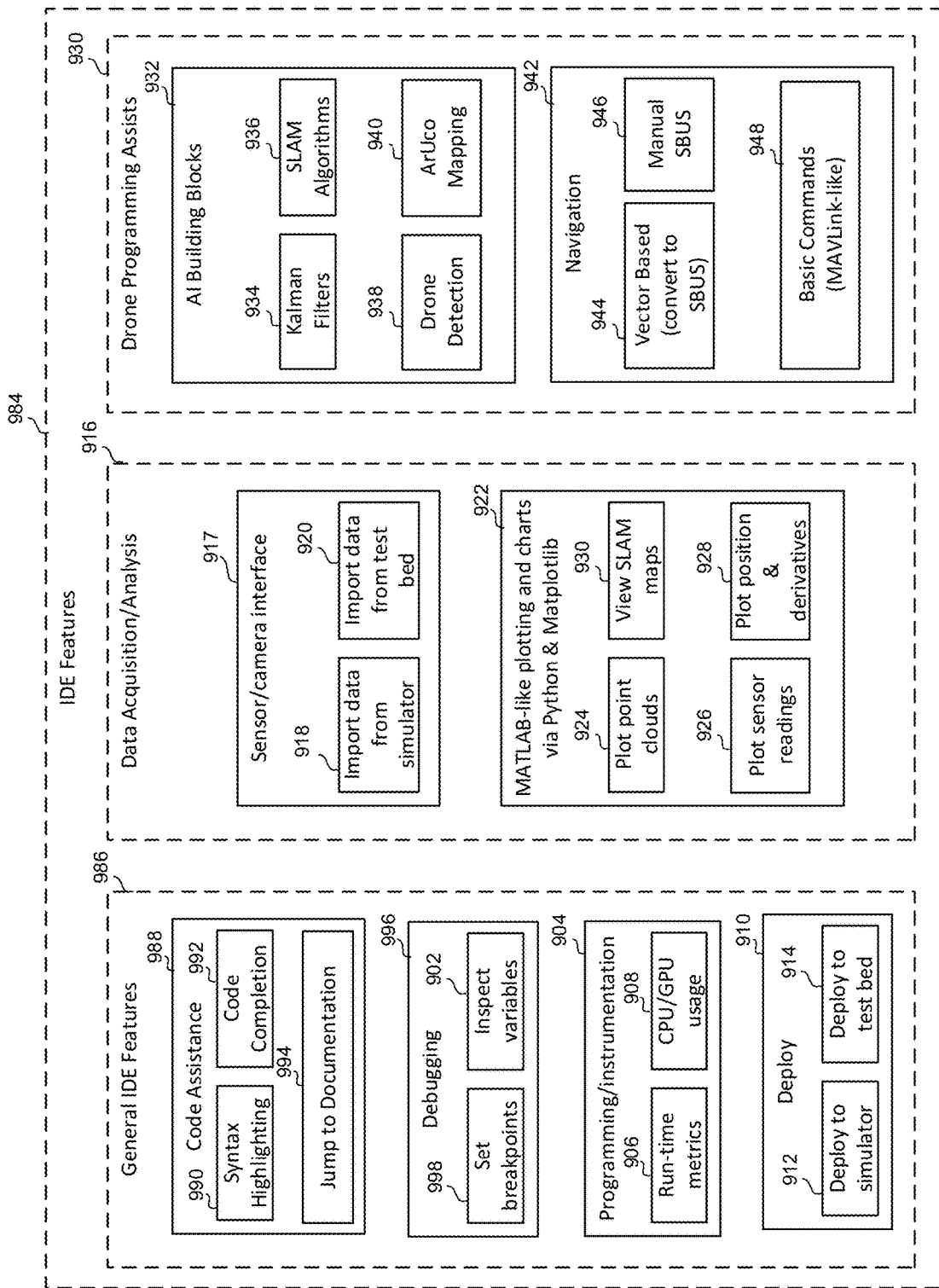
FIG. 9 shows an example of an Integrated Development Environment (IDE) features.

FIG. 9 illustrates some features of an Integrated Development Environment (IDE) 984 that may be used to develop AI code such as participant code 520. IDE 984 may include elements of SDK 876 shown in FIG. 8, with additional elements, and may be provided to participants for use in a development process as illustrated in FIG. 4. This provides a large number of features to a participant so that the participant does not have to develop these features and can focus on AI code for flying a drone. The IDE provides a participant with IDE features 984 including general IDE features 986, which include code assistance 988. Code assistance 988 includes features such as syntax highlighting 990 (allowing source code to be displayed in different colors and/or fonts according to the category of code terms), code completion 992 (e.g. providing popups querying parameters of functions and identifying syntax errors) and jump to documentation 994 (allowing a direct jump from an editor to related documentation). General IDE features 986 also include debugging 996, which includes features such as set breakpoints 998 (allowing a user to set breakpoints in AI code for debugging purposes) and inspect variables 902 (allowing a user to get variable values at a breakpoint). General IDE features 986 also include profiling/instrumentation features 904, such as run-time metrics 906 (showing metrics such as load and memory usage) and CPU/GPU usage 908 (displaying CPU/GPU usage to user). General IDE features 986 also include Deploy features 910, such as deploy to simulator features 912 (to facilitate deployment to a simulator such as simulator 502 implemented in workstation 628) and deploy to test bed features 914 (to facilitate deployment to a test bed with hardware components, e.g. live hardware 510).

In addition to General IDE features 986, IDE features 984 include data acquisition/analysis features 916, such as Sensor/camera features 917 and MATLAB-like plotting and charting via Python & Matplotlib 922. Sensor/camera features 917 include import data from simulator 918 (to import simulated sensor/camera from a simulator, such as simulator 502, for use by an AI controller running AI code) and import data from test bed 920 (to import data from actual sensors/cameras on a test bench, such as live hardware 510, for use by an AI controller running AI code). MATLAB-like plotting and charting via Python & Matplotlib 922 includes features such as Plot point clouds 924, plot sensor readings 926, and plot position and derivatives 928 (to plot these elements to provide graphical illustration for users). MATLAB-like plotting and charting via Python & Matplotlib 922 also includes the feature view SLAM maps 930 to allow a user to view maps related to location and mapping.

IDE features 984 also include Drone Programming Assists 930, including features such as AI building blocks 932 and Navigation 942. AI Building Blocks 932 includes Kalman filters 934 (to estimate unknown variables from statistical data), SLAM algorithms 936 (algorithms related to localization and mapping), drone detection 938 (to detect other drones for collision-avoidance or other purposes), and ArUco Mapping 940 (a library for Augmented Reality (AR) applications based on OpenCV). Navigation 942 features include vector-based features 944 (including conversion of navigation data to SBUS protocol), manual SBUS 946, and basic commands 948 (a set of commands that may be MAVLink commands or MAVLink-like so that a common command set is used between AI controllers and simulators, test bench hardware, and live drone hardware). It should be noted that the features illustrated in the example of FIG. 9 is not indented to be exhaustive and that an actual IDE may provide additional features, or may omit one or more of the features shown. Furthermore, participants may choose which features to use and how to use them.

IDE features 984 shown provide the user with various capabilities including the following:

Produce an AI module which will let the user execute code in one of several threads, in either C or Python (may not be 100% parity between Python and C, but definitely useful for prototyping).

Output of the build is a shared object which gets loaded by the master AI process and executed sequentially.

Interact with the simulator.

Debug their code.

It may do this, for example, by using Eclipse IDE as a basis to provide a strong IDE, and developing plugins which handle communications with the simulator, custom project types, built in help where possible, debugging via GDB, logging, and import/export of flight output, e.g. to a Jupyter notebook, or as raw data. The IDE may leverage Eclipse C/C++ and Pydev to provide a unified experience in both languages. Communication between the AI controller and the simulator may be via an asynchronous messaging library, such as ZeroMQ, keeping time synchronized between the simulator and AI code.

Simulator

Figure 10A:
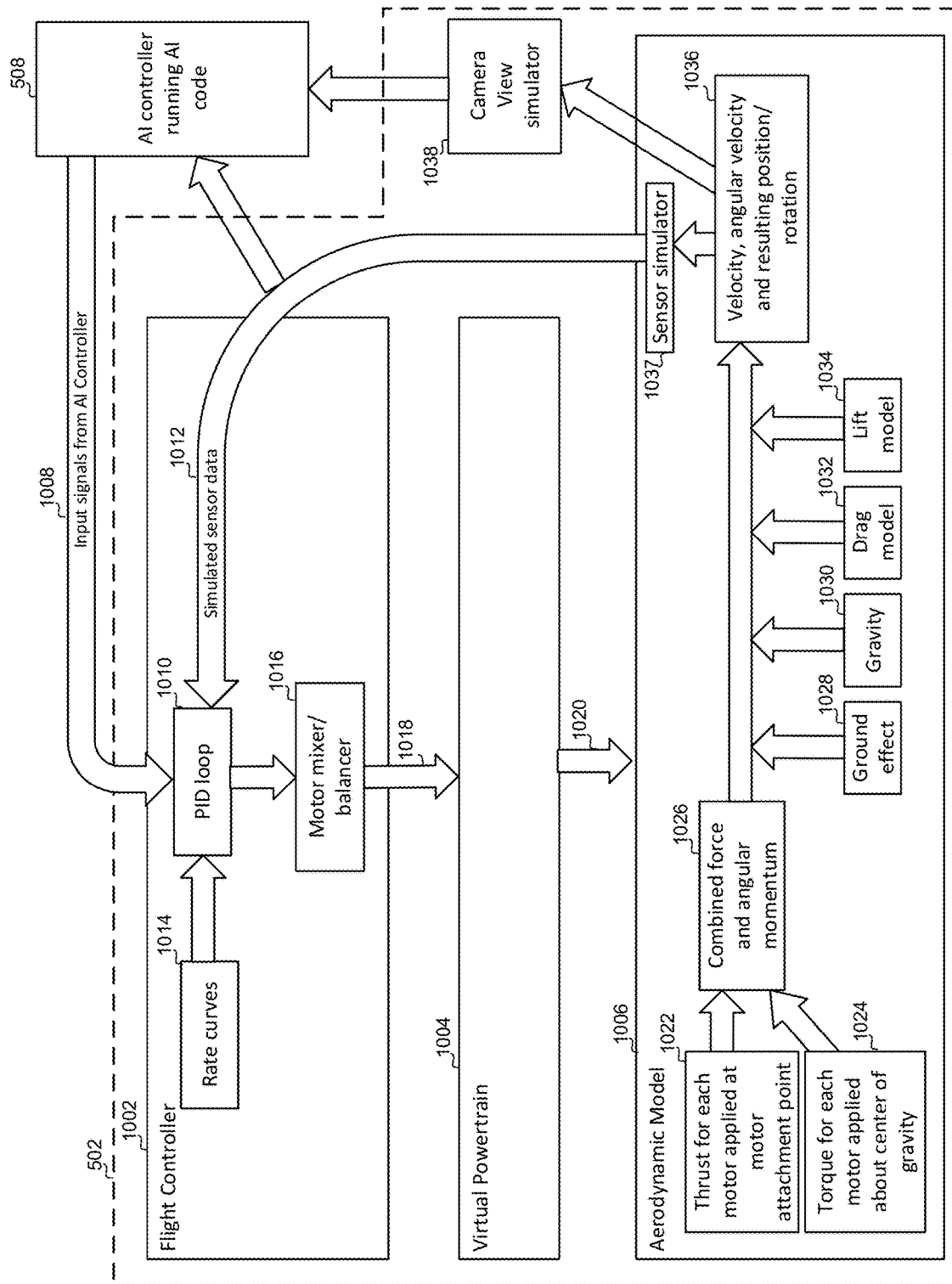
FIGS. 10A-C show aspects of an example of a quadcopter simulator.
Figure 10B:
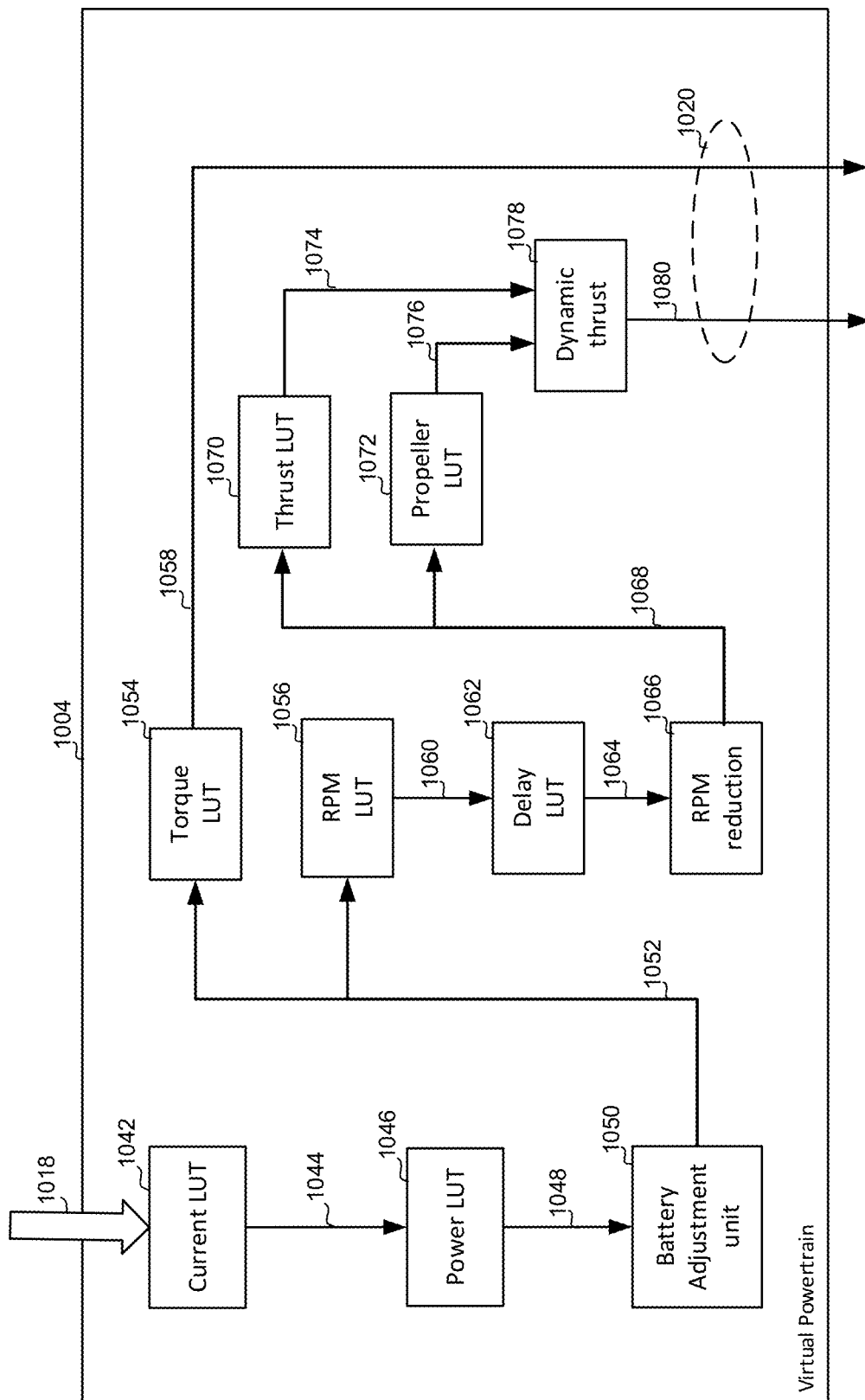

FIG. 10A illustrates some aspects of simulator 502 and its operation. FIG. 10 shows simulator 502 coupled to AI controller 508 to simulate a drone (e.g. quadcopter) piloted by AI code on AI controller 508. Three modules of simulator 502 include the flight controller 1002, virtual powertrain 1004 (shown in detail in FIG. 10B), and aerodynamic model 1006. AI code running on AI controller 508 generates input signals 1008, including commands, which may be the same as commands used for remote-control of a drone. For example, the same command set may be used (e.g. MAV-Link, or MAVLink-like commands). Commands may include four axis signals (thrust, yaw, pitch, and roll) in UDP format.

Input signals 1008 are sent to flight controller 1002, which may use the same flight controller code used in an actual drone (e.g. may use the same code as flight controller 211). Flight controller 1002 includes a PID loop module 1010 that receives input signals 1008 from AI controller 508 and simulated sensor data 1012 from aerodynamic model 1006 (real sensor data would be used in real drone) and uses rate curves 1014 to calculate outputs to execute the commands received in input signals 1008. Rate curves 1014 may include separate rate curves for thrust, yaw, pitch, and roll, and may reflect rate of change in degrees per second. PID loop module 1010 determines differences between desired rotational position and current rotational position and differences in a previous cycle and applies PID tune parameters to generate control signals. This may occur separately for pitch, roll, and yaw to generate control signals accordingly. These outputs are sent to motor mixer/balancer 1016, which generates Electronic Speed Control (ESC) outputs 1018, corresponding to the four motors of a quadcopter. Where flight controller 1002 is implemented as a flight controller of an actual drone, these outputs control the motors to fly the drone. Where flight controller 1002 is implemented as a flight controller of simulator 502 as shown, ESC outputs are provided to virtual powertrain 1004. Thus, Flight controller 1002 is configured to perform Proportional Integral Derivative (PID) control of quadcopter motors to generate flight controller output signals corresponding to four simulated quadcopter motors of a simulated quadcopter.

Virtual powertrain 1004 (powertrain module) receives ESC output 1018 as four input signals corresponding to four quadcopter motors, with each input signal handled independently on each frame of simulation. Virtual powertrain 1004 calculates torque and thrust from ESC output 1018 according to characterization data of drone components (described in more detail below). Precise characterization of hardware components allows virtual powertrain 1004 to closely model real hardware (i.e. powertrain of an actual quadcopter) and to accurately calculate torque and thrust values that are generated in a real drone over a range of conditions including dynamic conditions (e.g. accounting for drone orientation and velocity in any thrust calculation). Signals 1020 representing torque (e.g. in Newton-meters "Nm") and thrust (e.g. in Newtons) are sent from virtual powertrain 1004 to aerodynamic model 1006. Virtual powertrain 1004 is configured to generate thrust and torque values for the four simulated quadcopter motors from the flight controller output signals 1018 using a plurality of lookup tables with entries indicating quadcopter component characteristics in an accurate manner.

Aerodynamic model 1006 (aerodynamic module) is based on a calculation of a center of mass of a drone by adding up individual weight contributions of drone components and their distribution. Simulated thrust for each individual motor (e.g. each of four motors of a quadcopter) is applied at the motor attachment point 1022 (i.e. away from the center of mass of the drone). Depending on the balance of individual thrust contributions, combined thrust may generate some rotational forces (e.g. pitch and roll) about the center of mass of the drone. Accordingly, torque for each motor is applied about the center of gravity 1024. These calculations are used to calculate resulting combined force and angular momentum 1026 produced on the drone. If there is a hard surface below the drone that is substantially parallel to the plane of the propellers, then the resulting thrust is amplified according to the inverse square of the distance to that surface producing "ground effect." Force and angular momentum are corrected for ground effect by ground effect correction 1028, which may be in the form of a lookup table based on simulated height (e.g. output of a simulated altimeter or other height sensor). Gravity effects 1030 are also applied and a drag model 1032 is applied to account for drag forces for different drone surfaces (e.g. top, sides) based on different drag coefficients for different surfaces. Drag model 1032 may result in both drag forces (opposite to the direction of drone movement) and lift forces (perpendicular to the direction of drone movement) depending on drone orientation. Drag and lift forces may be applied at the center of mass according to drag factors based on drone surface area and average drag coefficients. Aerodynamic module 1006 is coupled to receive the thrust and torque values 1020 from the virtual powertrain 1004, the combine the thrust and torque values for the four simulated quadcopter motors and apply additional factors (e.g. ground effect from proximity of ground below, gravity, lift and drag from movement through air) to obtain velocity, angular velocity, and resulting position/rotation 1036 of the simulated quadcopter, and to provide simulated sensor data 1012 according to the velocity, angular velocity, and position to the flight controller 1002.

Combined force (thrust) for all motors applied at the center of mass, compensated for ground effect, gravity, drag, lift, and any other significant factors, is used to calculate change in drone velocity (change from prior drone velocity), while combined torque for all motors is used to calculate change in angular velocity. Thus, velocity and angular velocity are calculated and from these values the updated position and rotational position (angular orientation) may be calculated. Velocity, angular velocity and resulting position/rotation 1036 may be used by sensor simulator 1037 to generate simulated sensor data 1012, which is fed back to flight controller 1002. This feedback may be provided at a suitable frame rate or frequency (e.g. 60 Hz). Sensor simulator 1037 may simulate output from simulated sensors corresponding to drone sensors such as IMU sensors (e.g. including gyroscope and/or accelerometer components).

In addition to providing simulated sensor data 1012 back to flight controller 1002, for use by PID loop 1010, velocity, angular velocity and resulting position/rotation 1036 may be used by camera view simulator 1038 (camera simulator) to generate simulated camera view renderings. For example, a simulated environment may include simulated ground, walls, gates, drones, and/or other stationary and/or moving objects that are then simulated in camera renderings according to the position/rotation of the simulated drone. In one example, camera view simulator 1038 generates six simulated camera views that are paired to form three simulated stereoscopic camera views that cover different areas of a simulated environment around a simulated drone. Camera view renderings, along with raw simulated sensor data are provided to AI controller 508, which may then select a pathway for the drone based on the simulated camera views and simulated sensor data. Thus, AI controller 508 "sees" the simulated environment around the simulated drone and receives additional simulated sensor data and can pilot the simulated drone accordingly by generating commands to control the simulated drone (input signals 1008).

FIG. 10B shows an example implementation of virtual powertrain 1004 that provides accurate drone simulation based on bench testing of hardware to accurately characterize drone components. While human pilots using drone using a drone simulator may compensate for inaccuracy in simulator output, an AI pilot may be more sensitive in some cases and accurate simulation may be beneficial. For example, using a simple equation to model behavior of a component may fail to account for some real effects (e.g. turbulence affecting propeller efficiency). Where a simulator is used to train an AI controller (e.g. providing a training set for machine learning) inaccuracy in simulator output may result in an AI controller that is not well adapted for flying a real drone. According to an example presented here, accurate characterization of hardware components is performed and used to generate lookup tables that are quick and easy to access and can be incorporated into a simulator.

FIG. 10B illustrates handling of a single ESC input, corresponding to a single motor, used to generate torque and thrust by virtual powertrain 1004. It will be understood that each such ESC input is separately handled in a similar manner in virtual powertrain 1004 with the resulting torque and thrust components combined in Aerodynamic model 1006. ESC output 1018 from flight controller 1002 provides an ESC input to a current lookup table, current LUT 1042. Current LUT 1042 relates ESC inputs with electrical current based on bench testing of a motor. For example, current LUT 1042 may include a number of entries reflecting average current generated in response to a given ESC input during testing of a significant number of motors (e.g. in excess of 20) over their operational range (e.g. collecting data at 10, 20, or more data points spanning the current range of a motor). Thus, output 1044 of Current LUT 1042 is a current (e.g. expressed in Amps) obtained from an entry corresponding to the ESC input to provide current for different command inputs. Output 1044 is provided to a power lookup table—Power LUT 1046. Power LUT 1046 is a lookup table that relates current with power (e.g. from Amps to Watts) based on bench testing of a significant number of motors over their operational range (e.g. from zero Amps to a maximum current). Output 1048 of power LUT 1046 is a power (e.g. in Watts), which is provided to Battery adjustment unit 1050. Battery adjustment unit 1050 uses data related to battery condition (e.g. due to internal resistance, charge level, and/or other factors) as a function of power and may reflect a reduction in power due to such factors so that output 1052 may be a reduced power to account for such effects. Battery adjustment unit 1050 may include one or more lookup table obtained from bench testing of a significant number of batteries over their operational range and under different conditions (e.g. different output currents, different levels of charge, etc.) Output 1052 is provided to Torque LUT 1054 and RPM LUT 1056. Torque LUT 1054 includes entries providing motor torque at different power so that torque output 1058 is a torque value corresponding to a torque generated in a motor of a drone. RPM LUT 1056 is a lookup table that includes entries providing Revolutions Per Minute (RPM) of a motor at different power so that output 1060 is an RPM estimate. Both Torque LUT and RPM LUT may be based on testing of a significant number of motors across their operational range e.g. from zero RPM to a maximum RPM, from zero torque to a maximum torque. Output 1060 is provided to Delay LUT 1062, which includes entries that reflect delay in increasing RPMs under different conditions (e.g. different starting RPM) found from bench testing. Delay LUT 1062 applies the corresponding delay or delays to provide output 1064, which changes RPM compared at an appropriate rate to reflect actual motor response. Output 1064 is sent to RPM reduction unit 1066, which calculates propeller rotation speed limits based on propeller tip speed and propeller drag from current RPM and drone speed and reduces RPM accordingly. Thus, output 1068 of RPM reduction unit 1066 may be a reduced RPM compared with output 1064 under some conditions. This may combine propeller speed (in RPM) with drone velocity to dynamically adjust maximum RPM. Output 1068 is provided to Thrust LUT 1070 and Propeller LUT 1072. Thrust LUT contains entries relating motor static thrust to motor RPM based on bench testing of a significant number of motors. Thus, Thrust LUT 1070 generates output 1074, which is a static thrust value. Propeller LUT 1072 contains entries relating propeller efficiency and RPM based on bench testing a significant number of propellers and may reflect effects such as turbulence that may not be accounted for in a simple propeller model. Thus, Propeller LUT 1072 generates output 1076, which is a propeller efficiency. Outputs 1074 and 1076 are provided to dynamic thrust unit 1078, which calculates dynamic thrust values from combining static thrust and propeller efficiency to generate dynamic thrust output 1080 accordingly. Dynamic thrust output 1080 from dynamic thrust unit 1078 and torque output 1058 from Torque LUT 1054 are then sent to aerodynamic model 1006 as combined output 1020 as previously shown.

Figure 10C:
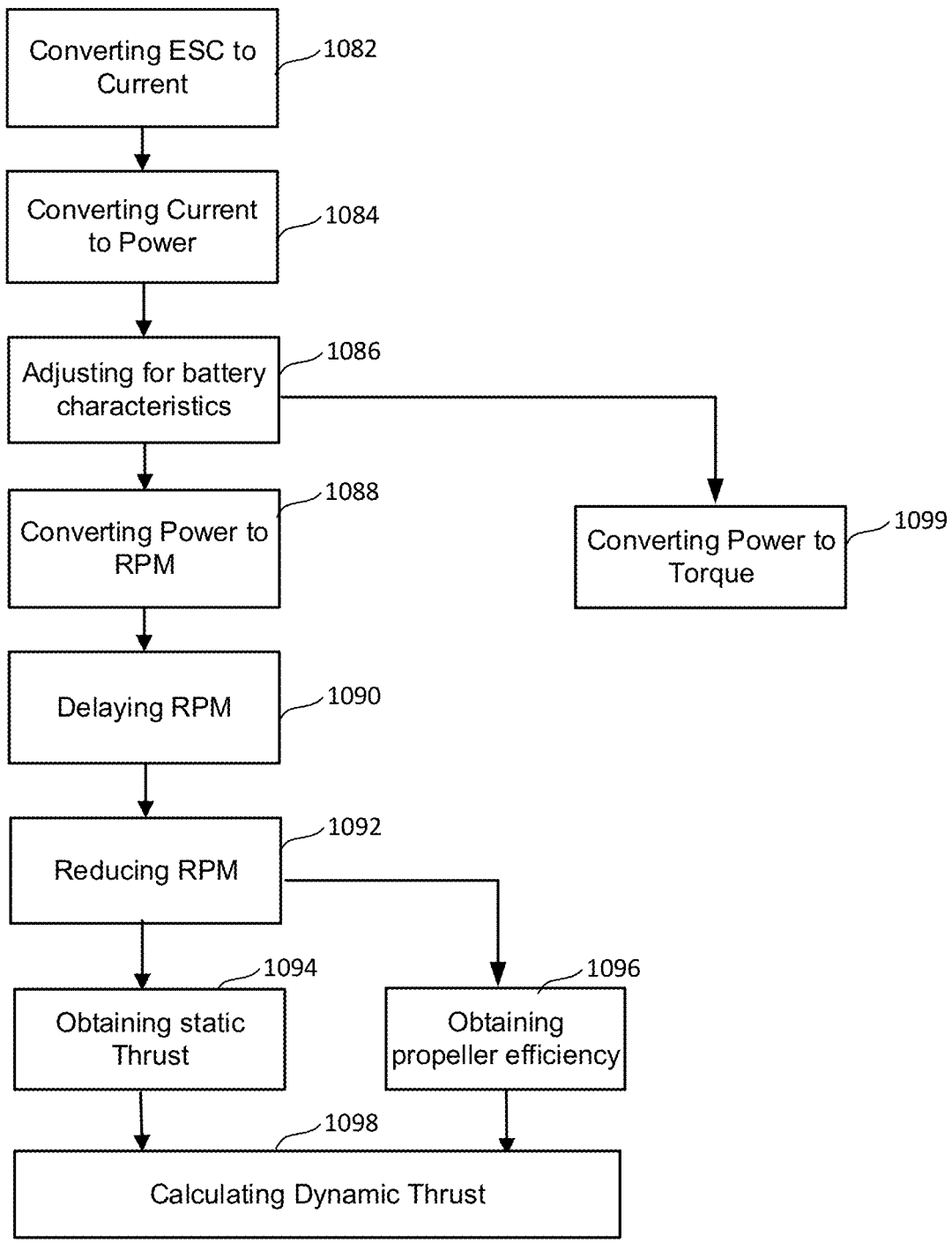

FIG. 10C shows steps performed by virtual powertrain 1004 to accurately convert an ESC input to dynamic thrust and torque outputs using lookup tables. The method shown includes the steps of converting ESC to current 1082 (e.g. using Current LUT 1042), converting the current to power 1084 (e.g. using Power LUT 1046), and adjusting for battery characteristics 1086 (e.g. using Battery adjustment unit 1050) to give an accurate power corresponding to the ESC signal received. This method further includes converting this power to RPM 1088 (e.g. using RPM LUT 1056), delaying RPM 1090 to reflect time for motor RPM to change (e.g. using Delay LUT 1062), and reducing RPM 1092 according to an RPM limit based on dynamic factors as needed (e.g. according to drone velocity). The delayed (and reduced, if needed) RPM is then used for obtaining static thrust 1094 (e.g. from Thrust LUT 1070) and obtaining propeller efficiency 1096 (e.g. from Propeller LUT 1072), which are then used for calculating dynamic thrust 1098. Calculated dynamic thrust is then provided as output to the aerodynamics simulator. Power, after adjusting for battery characteristics 1086, is also converted to torque 1099 and the torque value is provided to the aerodynamics simulator.

Figure 11:
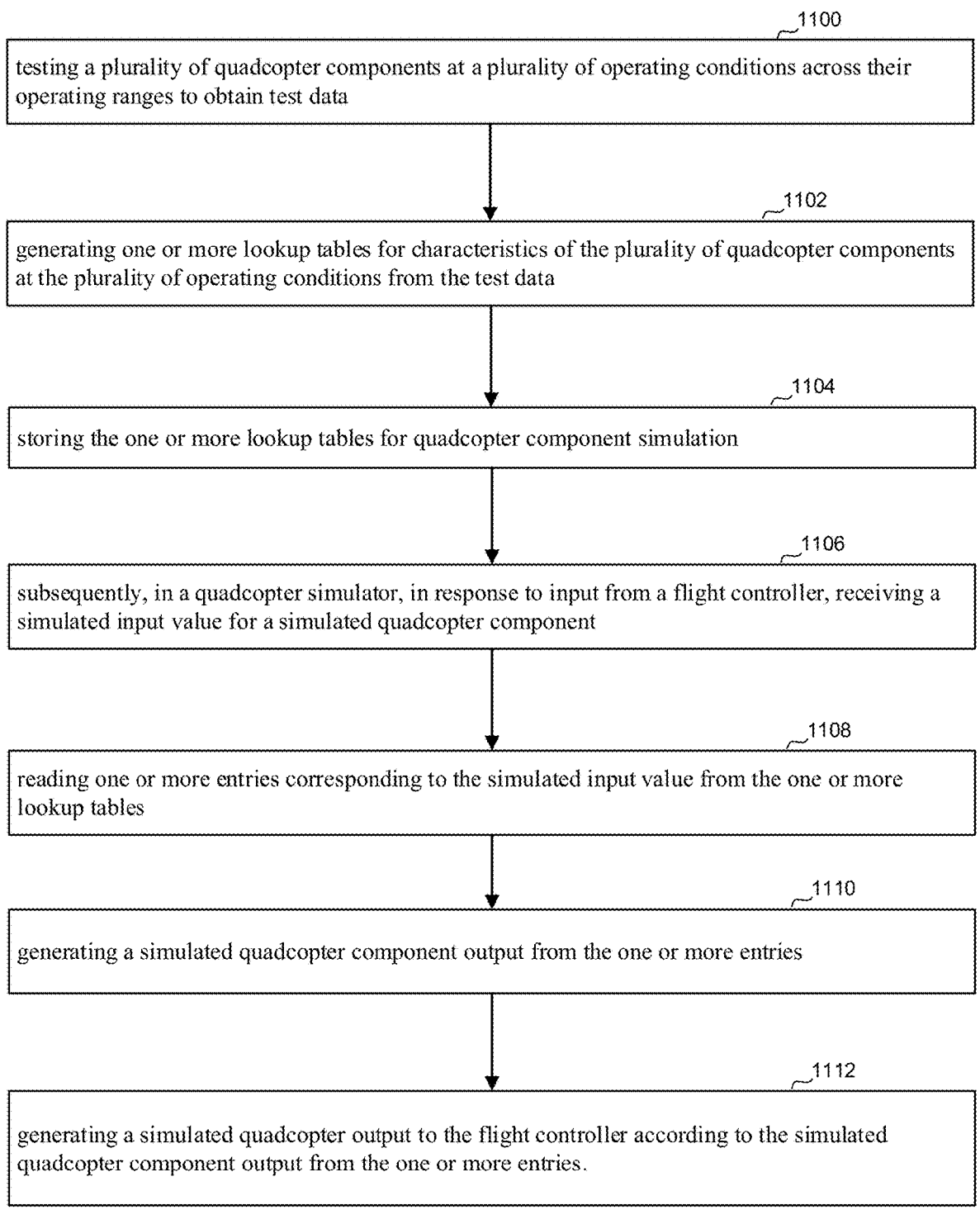
FIG. 11 shows an example method of testing quadcopter components for simulation.

FIG. 11 illustrates a method of quadcopter simulation that includes generating and using lookup tables. In particular, FIG. 11 shows a method of quadcopter simulation that includes testing a plurality of quadcopter components (e.g. quadcopter motors, quadcopter propellers, or quadcopter batteries) at a plurality of operating conditions across their operating ranges (e.g. testing quadcopter motors from zero revolutions per minute to a maximum number of revolutions per minute) to obtain test data 1100, generating one or more lookup tables for characteristics of the plurality of quadcopter components at the plurality of operating conditions from the test data 1102, and storing the one or more lookup tables for quadcopter component simulation 1104. The method further includes, subsequently, in a quadcopter simulator, in response to input from a flight controller, receiving a simulated input value for a simulated quadcopter component 1106, reading one or more entries corresponding to the simulated input value from the one or more lookup tables 1108, generating a simulated quadcopter component output from the one or more entries 1110, and generating a simulated quadcopter output to the flight controller according to the simulated quadcopter component output from the one or more entries 1112. Testing may include sending commands to quadcopter motors to rapidly change a number of Revolutions Per Minute (RPM), recording observed delay in actual change in RPM, generating the one or more lookup tables may include generating a delay lookup table from the observed delay.

Figure 12:
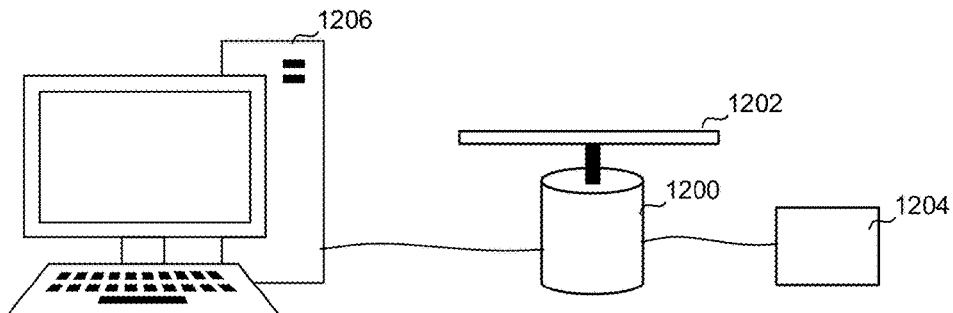
FIG. 12 shows an example of a test set-up for quadcopter component testing and characterization.

In order to have accurate lookup tables for virtual powertrain 1004, a significant number of drone components may be tested over a range of conditions. FIG. 12 illustrates test bench data collection to characterize components of a quadcopter (e.g. steps 1100 and 1102 of FIG. 11) that includes a quadcopter motor 1200 coupled to a propeller 1202 so that the quadcopter motor 1200 can spin the propeller 1202 under static conditions. A power source 1204 (e.g. battery with power controller) is coupled to quadcopter motor 1200 to provide electrical current in a controlled manner. A PC 1206 is connected to quadcopter motor 1200 and may be coupled to power source 1204 (e.g. to control power source 1204 to deliver a controlled current). PC 1206 may be coupled to sensors in or near quadcopter motor 1200 to monitor characteristics of quadcopter motor 1200 while it spins propeller 1202. For example, PC 1206 may record RPM values for quadcopter motor 1200 with different current provided by power source 1204. PC 1206 may record power values for different current provided. PC 1206 may record delay in change in RPM for quadcopter motor 1200 after a changed RPM setpoint is provided (e.g. providing a step function in requested RPM and measuring how long it takes actual RPM to reach the new set point). Such data may be gathered over the entire operating range of motor 1200 (e.g. from zero RPM to a maximum RPM), for example, at ten or more points between. Testing may be repeated for a statistically significant number of quadcopter motors and the results may be combined to generate lookup tables (e.g. by averaging). Similarly, a statistically significant number of propellers may be tested, and a statistically significant number of batteries may be tested, and associated lookup tables may be based on combining the test results. Batteries may be tested at different levels of charge, different current outputs, etc. Propellers may be tested at different RPM, proximity to ground (or similar surface). The apparatus shown in FIG. 12 may be used to generate lookup tables of a virtual powertrain (e.g. lookup tables 1042, 1046, 1054, 1056, 1062, 1070, 1072 of virtual powertrain 1004 of FIG. 10B and any other such lookup tables).

In general, a drone simulator (e.g. a quadcopter simulator) may provide outputs to a pilot (human pilot or an AI controller configured with AI piloting code) that are somewhat different from corresponding output from an actual drone. For example, real sensors and cameras may provide outputs that include some noise. The absence of noise may not be noticeable to a human pilot, or a human pilot may easily compensate for any noise effects. This may not be the case for an AI controller. In order to more accurately simulate sensor and camera output, simulated sensor noise may be added to simulated sensor outputs and simulated camera noise may be added to simulated camera outputs. While such noise may be produced by a random number generator in some cases, noise that more accurately reflects real sensor/camera noise may be obtained from test bench testing of actual components (e.g. under static conditions where the noise may be easily isolated). Statistically significant populations of components may be tested to obtain noise recordings that are then combined (e.g. averaged) to obtain simulated noise, which may be added to simulated outputs prior to sending such outputs from a simulator to an AI controller.

Figure 13:
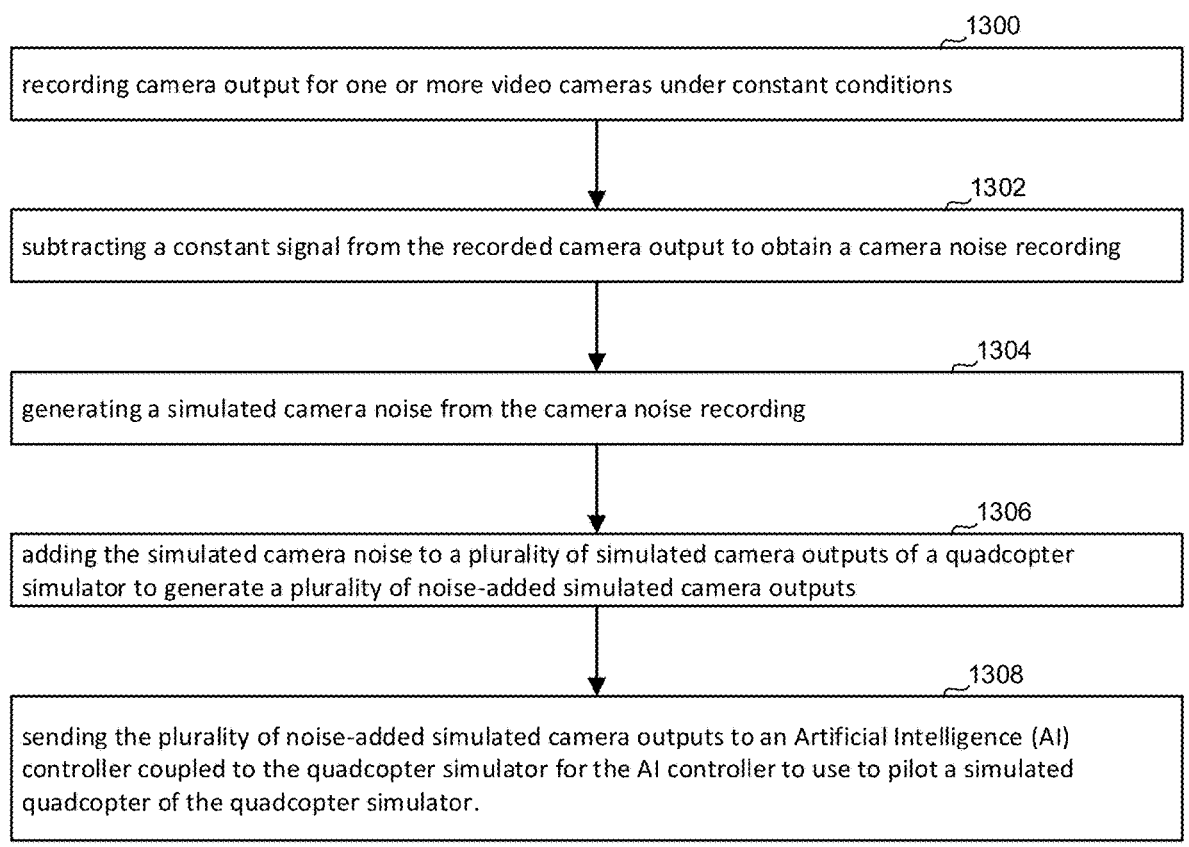
FIG. 13 shows an example of a method of obtaining simulated camera noise.

FIG. 13 shows an example of a method of quadcopter simulation (e.g. in simulator 502) that includes recording camera output for one or more video cameras under constant conditions 1300 (e.g. with camera lens covered), subtracting a constant signal from the recorded camera output to obtain a camera noise recording 1302, and generating a simulated camera noise from the camera noise recording 1304. Camera noise recordings from bench testing of a statistically significant number of cameras (e.g. more than ten) may be combined to generate the simulated camera noise from combined camera noise recordings from multiple cameras. The method also includes adding the simulated camera noise to a plurality of simulated camera outputs of a quadcopter simulator to generate a plurality of noise-added simulated camera outputs 1306, and sending the plurality of noise-added simulated camera outputs to an Artificial Intelligence (AI) controller coupled to the quadcopter simulator for the AI controller to use to pilot a simulated quadcopter of the quadcopter simulator 1308. For example, camera view simulator 1038 of FIG. 10A may add simulated camera noise to initial simulated camera outputs before sending the noise-added simulated camera outputs to AI controller 508.

Figure 14:
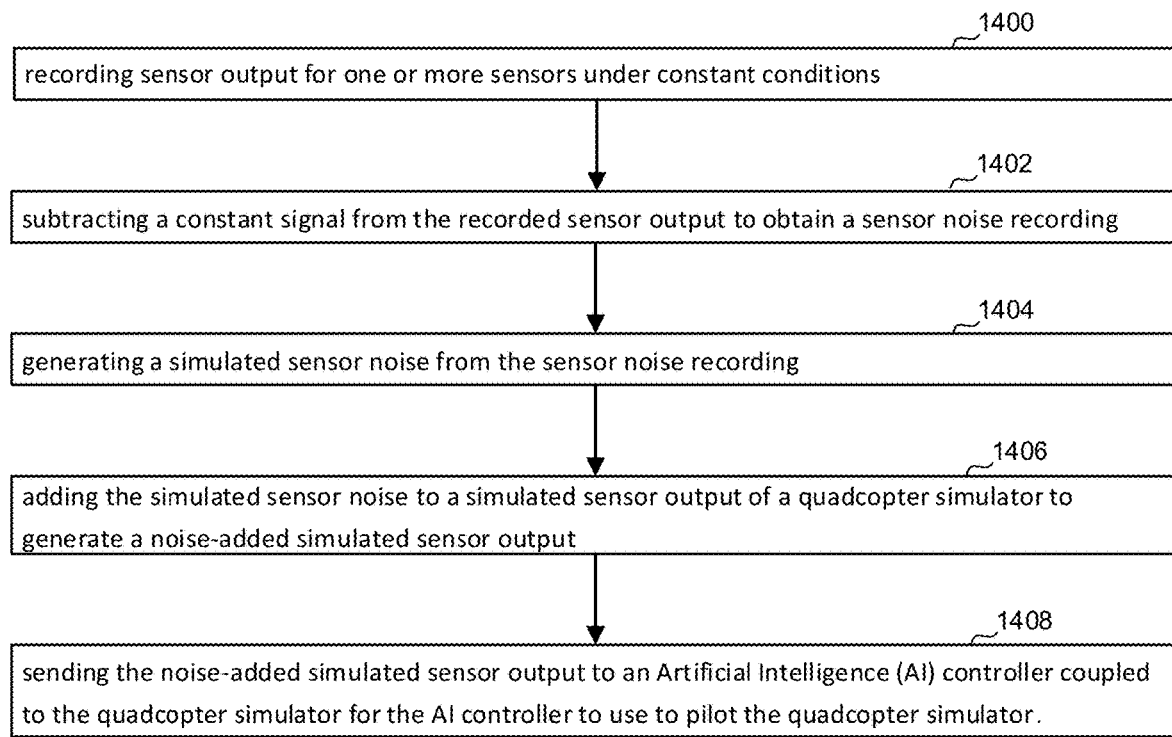
FIG. 14 shows an example of a method of obtaining simulated sensor noise.

FIG. 14 shows an example of a method of quadcopter simulation (e.g. in simulator 502), which may be used in combination with the method of FIG. 13, or separately. The method includes recording sensor output for one or more sensors under constant conditions 1400, subtracting a constant signal from the recorded sensor output to obtain a sensor noise recording 1402, generating a simulated sensor noise from the sensor noise recording 1404. Sensor noise recordings from bench testing of a statistically significant number of sensors (e.g. more than ten) over different conditions may be combined to generate the simulated sensor noise. The method also includes adding the simulated sensor noise to a simulated sensor output of a quadcopter simulator to generate a noise-added simulated sensor output 1406 and sending the noise-added simulated sensor output to an Artificial Intelligence (AI) controller coupled to the quadcopter simulator for the AI controller to use to pilot the quadcopter simulator 1408. For example, sensor simulator 1037 of FIG. 10A may add simulated sensor noise to initial simulated sensor outputs before sending the noise-added simulated sensor outputs to AI controller 508.

Figure 15:
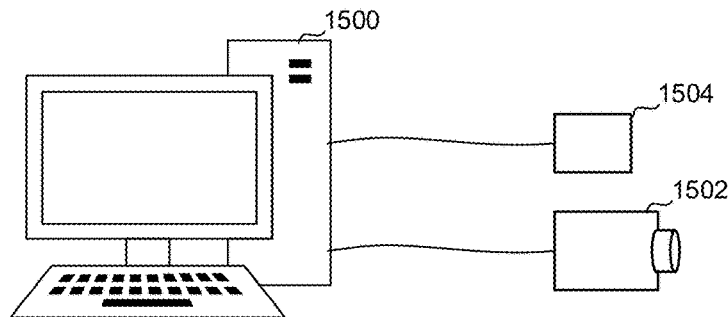
FIG. 15 shows an example of a test set-up for quadcopter component noise measurement.

FIG. 15 shows an example of an arrangement for performing the recording of step 1400 of FIG. 14. A PC 1500 with suitable recording capability is coupled to receive outputs from a camera 1502 and a sensor 1504. PC 1500 may record outputs while camera 1502 and sensor 1504 are in conditions to provide constant output. For example, camera 1502 may have its lens covered (for constant zero light conditions) or may be pointed to an unchanging image. Sensor 1504 may be a gyroscope (e.g. in an IMU) and may be spun at a constant speed (e.g. constant angular velocity around an axis) or may be an accelerometer that is at constant acceleration (e.g. stationary), or a rangefinder that is maintained a constant distance from an object or surface. A constant signal may be subtracted from recorded outputs to obtain camera and sensor noise for multiple cameras (e.g. ten or more cameras) and sensors (e.g. ten or more sensors) and these may then be used to generate simulated camera noise and simulated sensor noise to be added to simulated outputs of a simulator. Camera lens distortion, sensor error, and/or other effects may also be recorded during bench testing and may be incorporated into a simulated sensor and camera outputs.

Debugging

Figure 16:
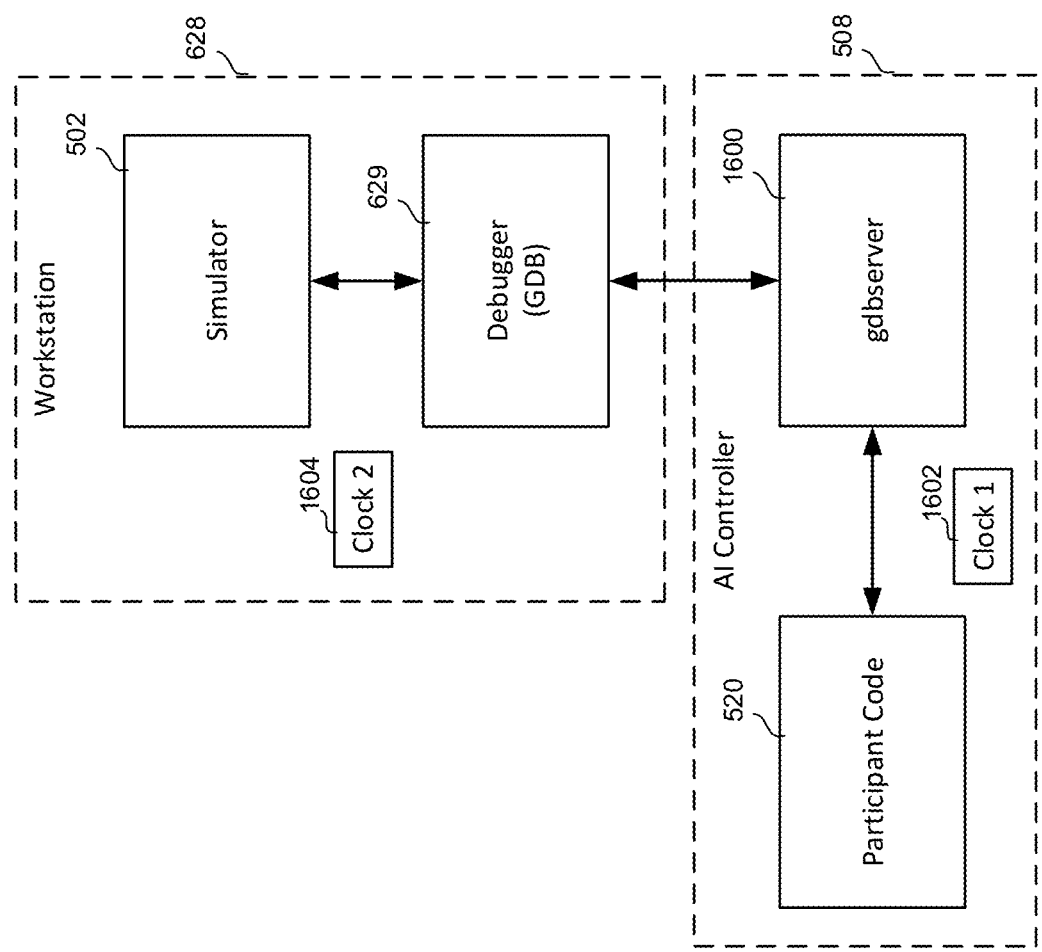
FIG. 16 shows an example of a workstation coupled to an AI controller for debugging AI piloting code while AI piloting code interacts with a simulator.

In order to ensure that AI code including participant code (e.g. participant code 520 operating in AI controller 508 of FIG. 5) is functional prior to deployment, debugging may be performed while AI code operates to pilot a simulated drone. For example, as shown in FIG. 6A, AI controller 508, running AI code, may be coupled to workstation 628 that includes simulator 502 and debugger 629. FIG. 16 provides an example implementation of such an arrangement that is suitable for debugging and that may be supported by an IDE (e.g. as debugging features 996 of general IDE features 986 illustrated in FIG. 9). Workstation 628 includes simulator 502 and debugger 629, which may be GNU Debugger (GDB). Debugger 629 allows insertion of breakpoints in AI piloting code (e.g. participant code 520) so that AI code stops at predetermined locations. Debugger 629 can then generate a list of AI code variable values of the AI piloting code at the breakpoint. Workstation 628 is coupled to AI controller 508 running participant code 520 (and other code for piloting a simulated drone). AI controller also includes gdbserver 1600, a program in AI controller 508 that works in conjunction with debugger 629 to debug participant code 520. Debugging-related communication between debugger 629 and gdbserver 1600 may be through an Ethernet connection between workstation 628 and AI controller 508 and may use a private IP address range. In this arrangement, simulator 502 is a quadcopter simulator configured to receive quadcopter flight control commands and to generate simulated sensor output and simulated camera output for a plurality of stereoscopic cameras of a simulated quadcopter, the quadcopter simulator implemented workstation 628. AI controller 508 is coupled to the workstation 628, the AI controller configured to receive the simulated sensor output and the simulated camera output for the plurality of stereoscopic cameras from the quadcopter simulator 502, determine a flightpath for the simulated quadcopter according to the simulated sensor output and the simulated camera output, generate the quadcopter flight control commands according to the flightpath, and provide the quadcopter flight control commands to the quadcopter simulator 502. Debugger 629 is implemented in the workstation 628, the debugger is coupled to the simulator 502 and the AI controller 508. The debugger 629 is coupled to perform debugging of AI code of the AI controller 508 (e.g. participant code 520) while the AI controller 508 generates the quadcopter flight control commands for the simulator 502.

AI controller 508 includes a first clock 1602 while workstation 1604 includes a second clock 1604. These clocks may be synchronized to a high level of accuracy to facilitate debugging. In particular, when an error occurs in participant code 520 it may stop while simulator 502 continues. Accurate synchronization allows simulator 502 to be rewound to a state corresponding to the error, or to an earlier state, so that operations leading up to and including the error in simulator 502 and participant code 520 can be examined. Simulator operations (e.g. quadcopter simulator operations) may be recorded (logged) so to facilitate stepping through operations to identify errors in participant code 520. A high degree of accuracy may be achieved using Precision Time Protocol (PTP), e.g. as detailed in IEEE 1588. Using PTP hardware timestamping may allow synchronization accuracy of less than 1 millisecond. Communication between simulator 502, debugger 629, gdbserver 1600 and participant code 520 may be PTP hardware timestamped so that the last communication from participant code 520 prior to a failure can be used to identify the timing of the failure with a high degree of accuracy and corresponding operations of simulator 502 may be found.

Figure 17:
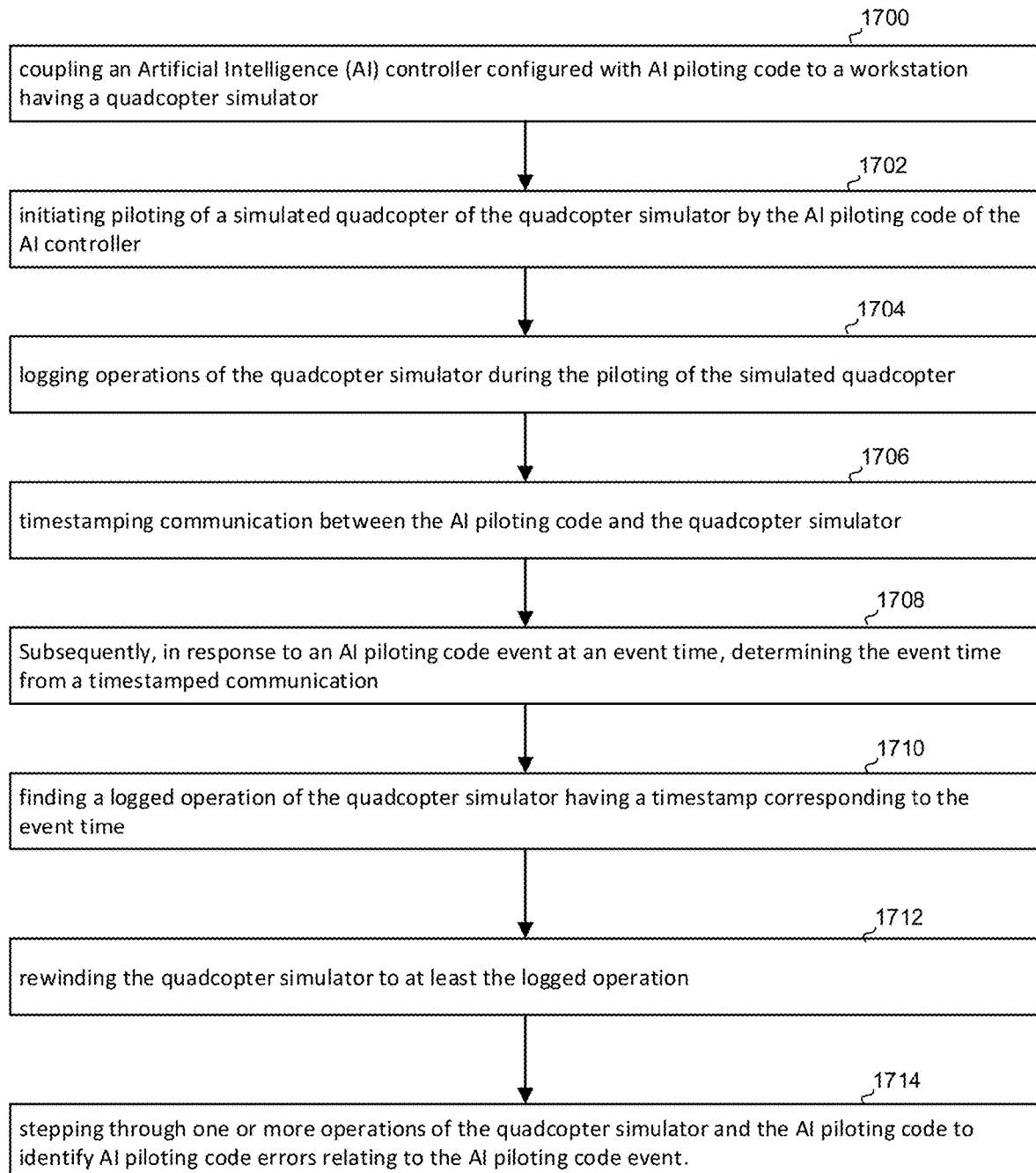
FIG. 17 shows an example of a method of debugging AI piloting code.

FIG. 17 illustrates an example of a method of debugging quadcopter piloting code that may be implemented using hardware illustrated in FIG. 16. The method includes coupling an Artificial Intelligence (AI) controller configured with AI piloting code to a workstation having a quadcopter simulator 1700 (e.g. coupling AI controller 508 to workstation 628 in FIG. 16), initiating piloting of a simulated quadcopter of the quadcopter simulator by the AI piloting code of the AI controller 1702, logging operations of the quadcopter simulator during the piloting of the simulated quadcopter 1704, and timestamping communication between the AI piloting code and the quadcopter simulator 1706. The method includes, subsequently, in response to an AI piloting code event at an event time, determining the event time from a timestamped communication 1708, finding a logged operation of the quadcopter simulator having a timestamp corresponding to the event time 1710, rewinding the quadcopter simulator to at least the logged operation 1712; and stepping through one or more operations of the quadcopter simulator and the AI piloting code to identify AI piloting code errors relating to the AI piloting code event 1714.

Figure 18:
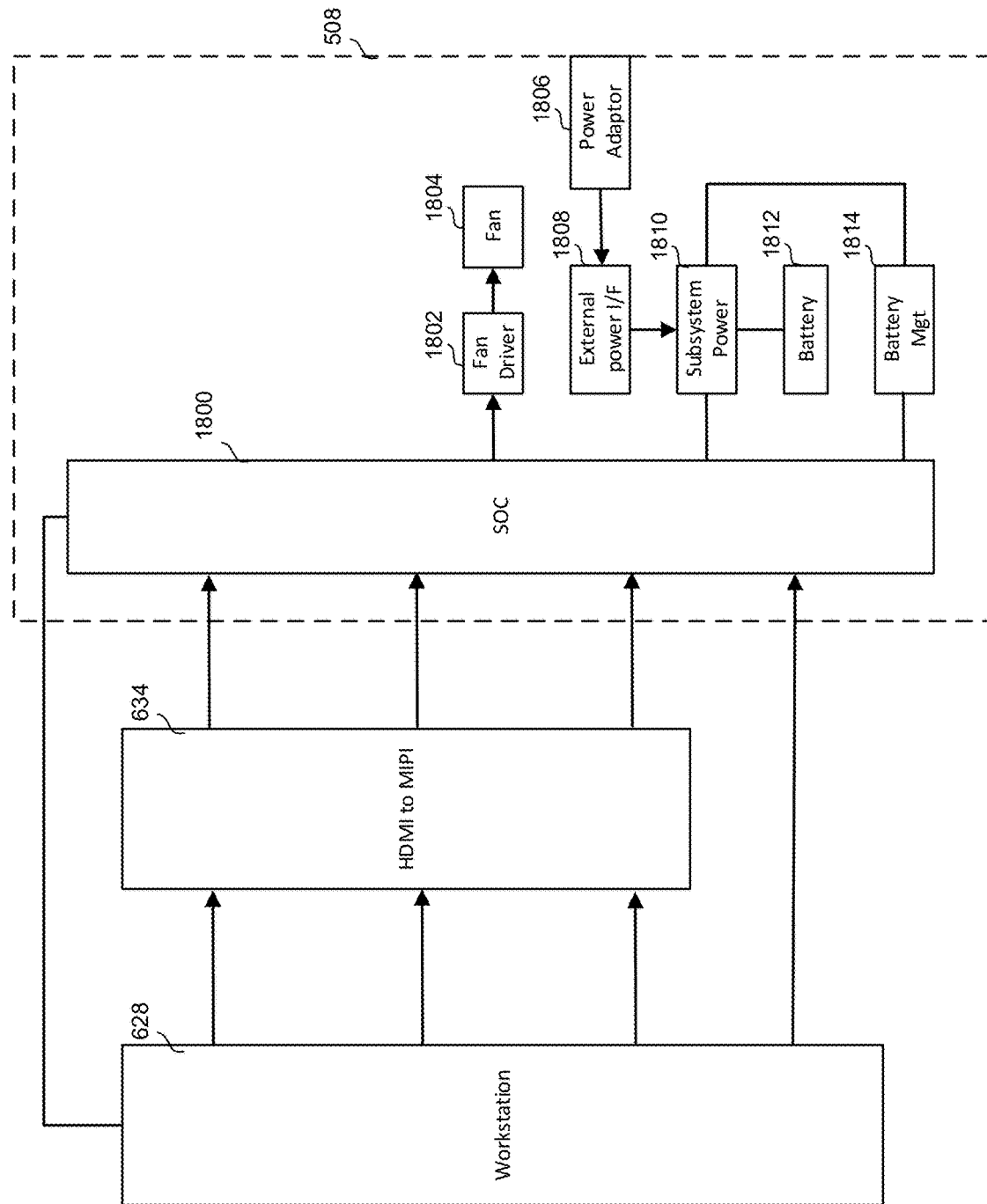
FIG. 18 shows an example of an AI controller coupled to a workstation.

An AI controller may be implemented using various components, with FIG. 18 providing an example of a controller module that includes a System-on-Chip (SOC) 1800 (e.g. NVIDIA Xavier SOC), which may include core CPUs (e.g. 12 Volta core GPUs and 8 core ARM 64 bit CPUs), RAM (e.g. 16 GB LPDDR4 memory) and additional components. This may be considered an implementation of AI controller 506 of FIG. 6A and is similarly shown coupled to workstation 628. HDMI to MIPI converter 634 converts simulated camera output from workstation 628 to MIPI format for AI controller 508. AI controller 508 includes a fan 1804 and fan driver 1802 to provide cooling as required (AI controller may be housed in an enclosure and may generate significant heat). A power adaptor 1806 and external power interface 1808 are provided to receive electrical power from an external source (e.g. power supply or battery) and provide it to subsystem power unit 1810. Subsystem power unit 1810 is also coupled to battery 1812 and battery management unit 1814 and can select a power source to power SOC 1800 and other components (e.g. using battery 1812 when external power is not available).

Figure 19:
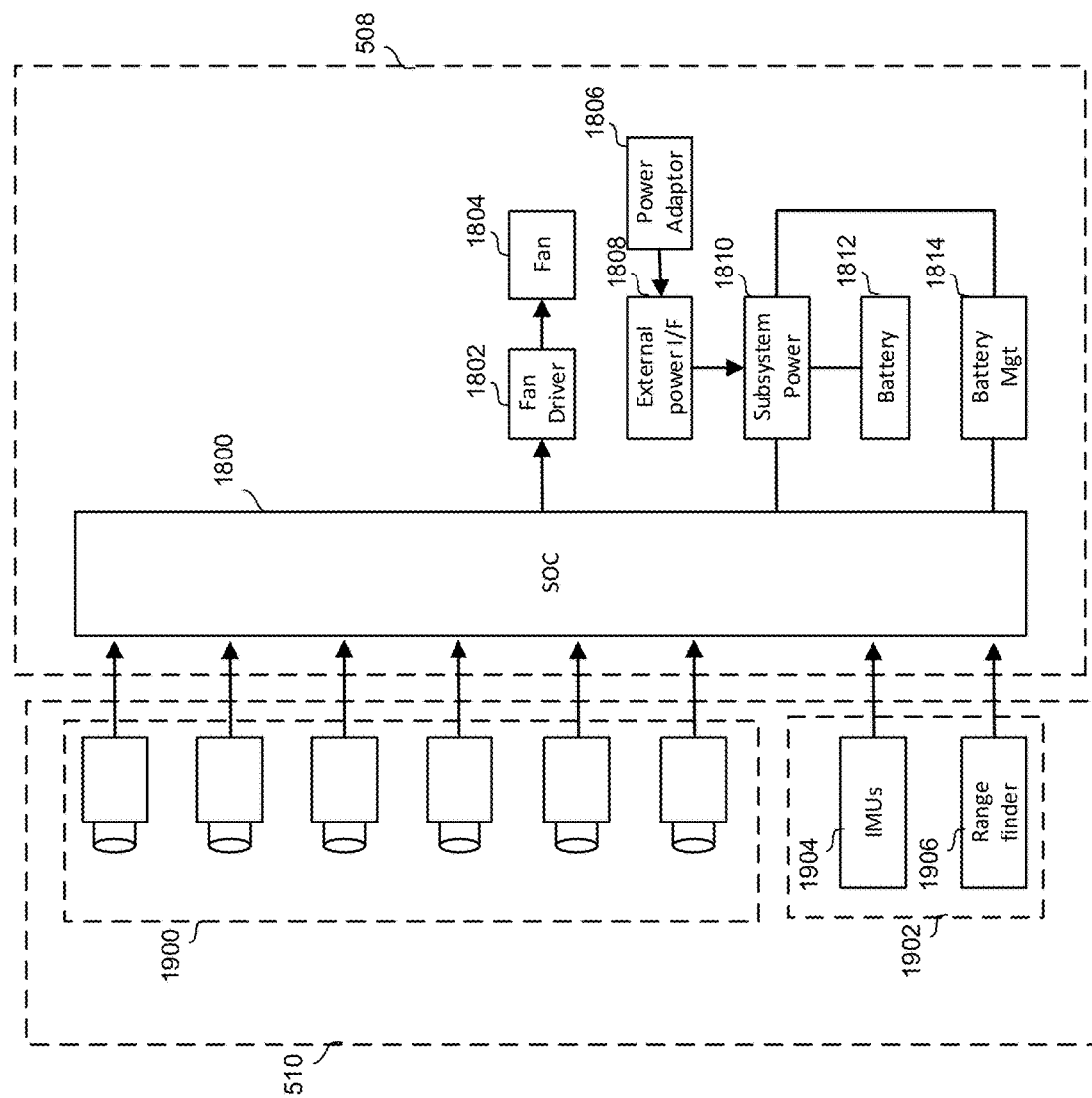
FIG. 19 shows an example of an AI controller coupled to live hardware.

In an alternative configuration, AI controller 508 may be coupled to live hardware (e.g. live hardware 510, shown in FIG. 6A, for live hardware testing). FIG. 19 shows an example in which live hardware 510 includes six video cameras 1900, for example, IMX265 MIPI cameras from Leopard Imaging, Inc. Live hardware 510 also includes sensors 1902 including IMUs 1904 and rangefinder 1906. IMUs 1904 may include two IMUs, for example a Bosch 6 axis BMI088 and an InvSense 6 axis MPU-6050 TDK. Rangefinder 1906 may be a Garmin LIDAR lite V3. The configuration of FIG. 19 may be used for hardware-in-the-loop testing of AI code of AI controller 508 after testing using a simulator as shown in FIG. 18.

Figure 20:
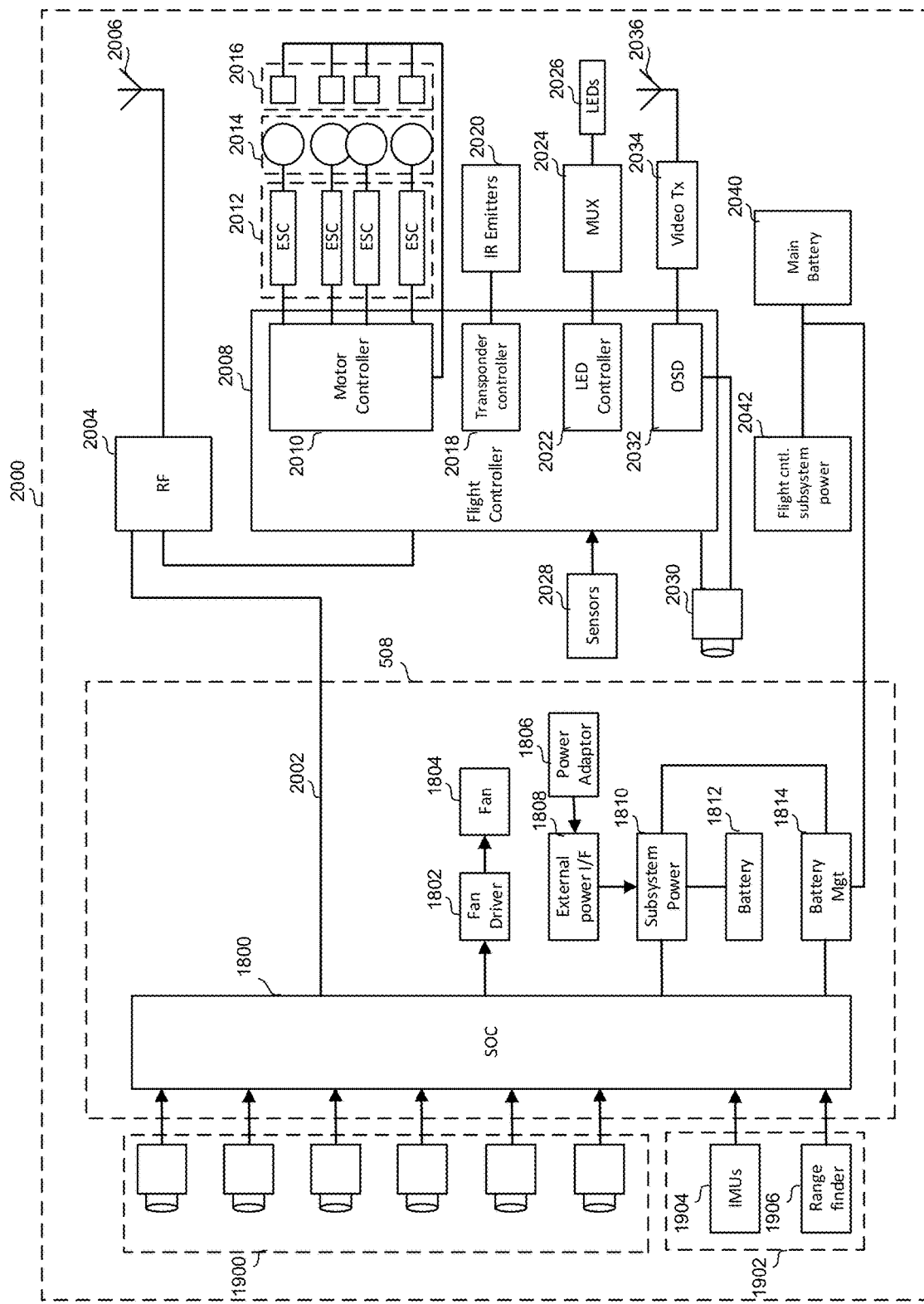
FIG. 20 shows an example of an AI controller in an autonomous drone.

When AI code is tested (e.g. using simulator and hardware-in-the-loop testing), the AI code may be deployed and used as an AI module of an autonomous drone to pilot the drone without remote-control input. FIG. 20 shows an example of AI controller 508 in an autonomous drone 2000, which is configured to be piloted by AI controller 508. Autonomous drone 2000 may be considered an example implementation of drone 301 of FIG. 3. Autonomous drone 2000 includes six video cameras 1900 (e.g. configured as three stereoscopic cameras) and sensors 1902 including IMUs 1904 and rangefinder 1906. Output 2002 (e.g. SBUS output) from AI controller 508 goes to an RF communications circuit 2004 (control radio module) which is connected to antenna 2006 (which may couple it to a remote unit or remote-control). RF communications circuit 2004 is coupled to flight controller 2008 to send flight control commands to flight controller 2008. Flight control commands may come from AI controller 508 or from a remote unit (via RF communications) according to the same command format so that commands are interchangeable. Thus, when RF communications circuit 2004 receives a command from a remote unit to take over piloting from AI controller 508, RF communications circuit 2004 stops sending the commands from AI controller 508 to flight controller 2008 and instead sends commands from the remote unit. Flight controller 2008 includes various modules including a motor controller 2010 module that controls four Electronic Speed Control (ESC) units 2012 that drive four quadcopter motors 2014 (which are coupled to corresponding fixed-pitch propellers—not shown). Hall effect sensors 2016 monitor quadcopter motors 2014 to provide feedback to motor controller 2010. A transponder controller 2018 controls infrared (IR) emitters 2020 that may be used to monitor a quadcopter as it flies around a racecourse. An LED controller 2022 controls LEDs 2026 (Light Emitting Diodes) through multiplexer 2024 (MUX) which may illuminate autonomous drone 2000. In addition to sensors 1902 coupled to AI controller 508, sensors 2028 may be directly connected to flight controller 2008 and may include one or more IMUS and a barometer (e.g. Bosch BMP280). In addition to cameras 1900 coupled to AI controller 508 for computer vision, quadcopter 2000 includes camera 2030, which may be used to send video to a remote user for remote-control piloting of quadcopter 2000 using first-person view (FPV). Output from camera 2030 is sent to On Screen Display unit 2032 and to video transmitter 2034 for transmission to the remote user via antenna 2036. A main battery 2040 provides a principal source of power for flight controller 2008 (including motors 2014) via flight controller subsystem power unit 2042 and, in this example also provides power to battery management unit 1814 of AI controller 508 (e.g. AI controller 508 may be powered from main battery 2040 or from battery 1812).

Figure 21:
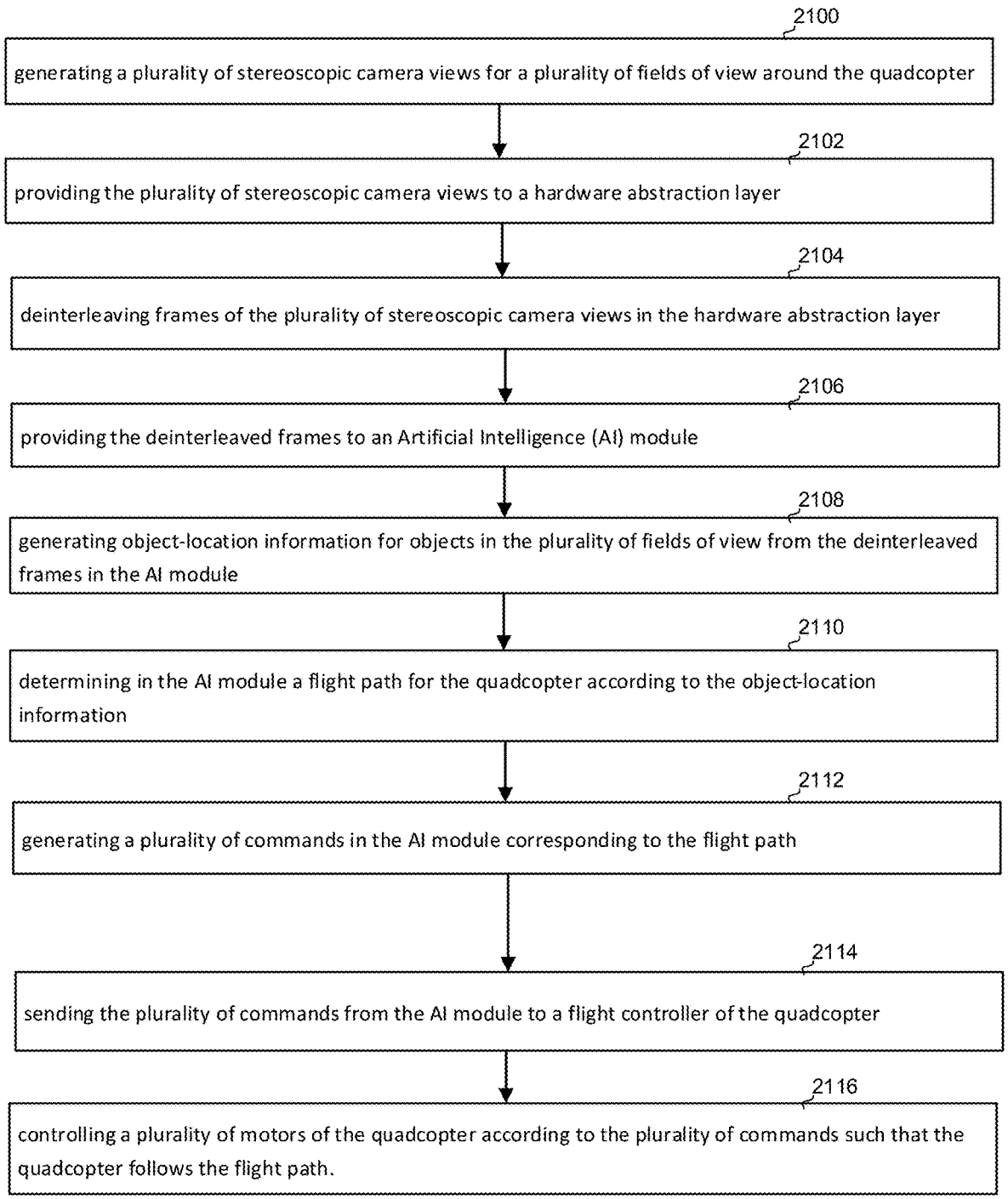
FIG. 21 shows an example of a method of operating an autonomous drone.

An autonomous quadcopter such as autonomous quadcopter 2000 of FIG. 20 may be operated so that it flies autonomously using an AI module such as AI controller 508 instead of a human pilot using a remote-control. An example of a method of operating a quadcopter is illustrated in FIG. 21 which includes generating a plurality of stereoscopic camera views for a plurality of fields of view around the quadcopter 2100, providing the plurality of stereoscopic camera views to a hardware abstraction layer 2102 (e.g. HAL 516), deinterleaving of the plurality of stereoscopic camera views in the hardware abstraction layer 2104, providing deinterleaved frames to an Artificial Intelligence (AI) module 2106, and generating object-location information for objects in the plurality of fields of view from the deinterleaved frames in the AI module 2108. For example, objects around a drone racecourse may be located and identified using computer vision based on stereoscopic camera views. The method further includes determining in the AI module a flight path for the quadcopter according to the object-location information 2110, generating a plurality of commands in the AI module corresponding to the flight path 2112, sending the plurality of commands from the AI module to a flight controller of the quadcopter; 2114, and controlling a plurality of motors of the quadcopter according to the plurality of commands such that the quadcopter follows the flight path 2116.

Figure 22A:
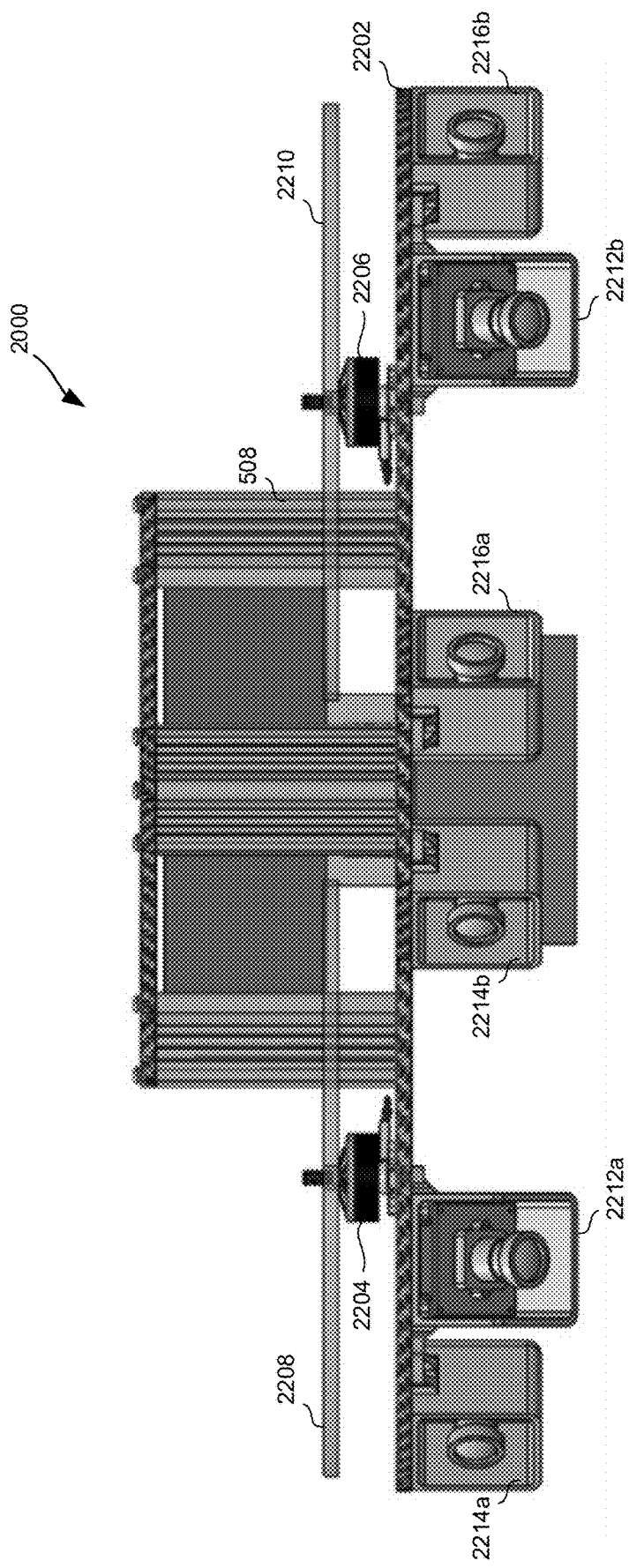
FIGS. 22A-D show different views of an example of an autonomous drone.

FIGS. 22A-D show an example of an implementation of autonomous drone 2000 as shown schematically in FIG. 20, which may be operated as illustrated in FIG. 21. FIG. 22A shows autonomous drone 2000 from the front with AI controller 508 mounted on top of chassis 2202 and with motors 2204, 2206 and corresponding propellers 2208, 2210 also mounted on top of chassis 2202. Motors 2204, 2206 correspond to two of four motors 2014 of FIG. 20 (the other two motors are not visible in this view. Six cameras are mounted on the bottom of chassis 2202. Cameras are arranged in pairs to form stereoscopic cameras. Thus, cameras 2212a and 2212b form a first stereoscopic camera looking down and forward of autonomous quadcopter 2000. Cameras 2214a and 2214b form a second stereoscopic camera looking forward and to the right of autonomous quadcopter 2000 (to the left in the view of FIG. 22A). Cameras 2216a and 2216b form a third stereoscopic camera looking forward and to the left of autonomous quadcopter 2000 (to the right in the view of FIG. 22A).

Figure 22B:
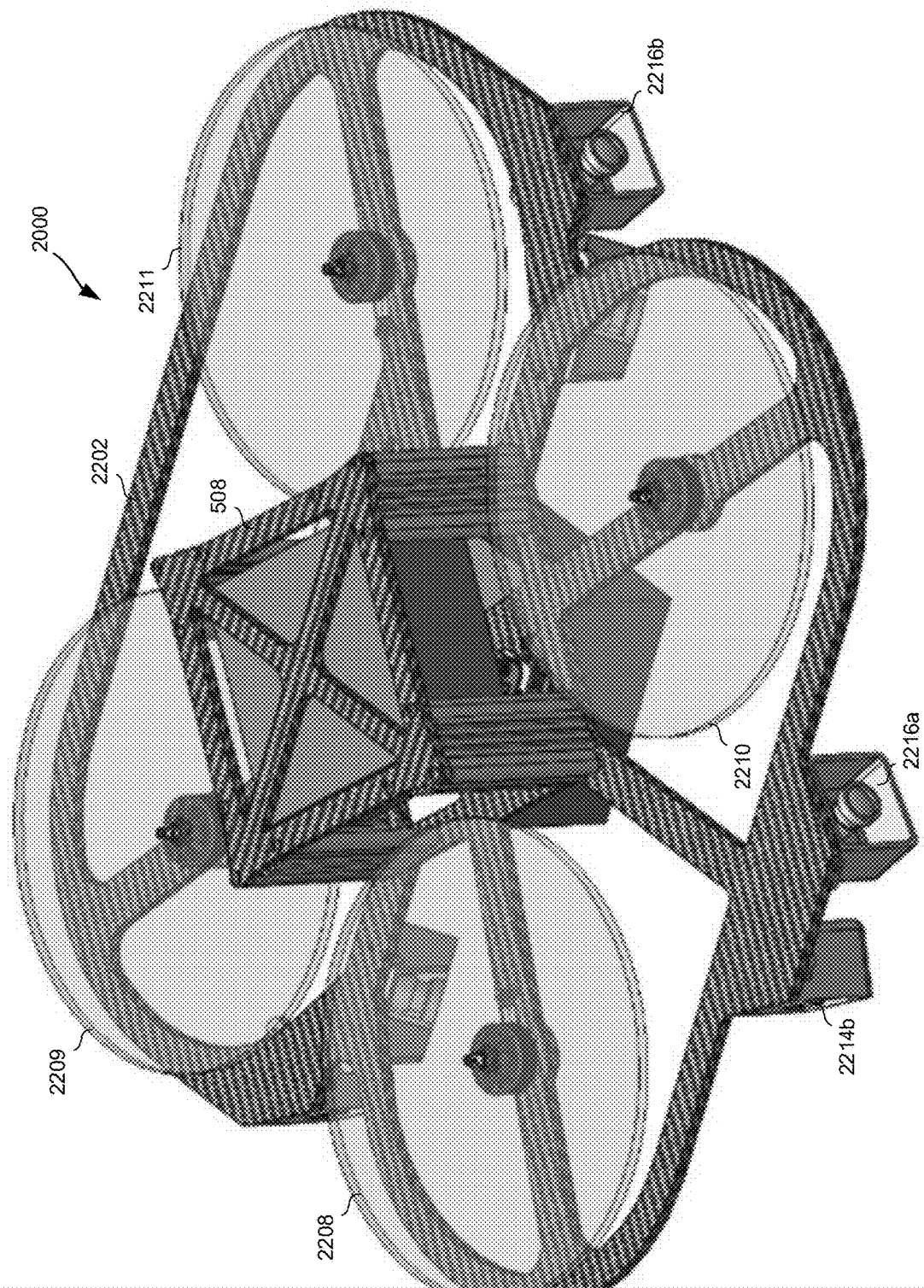

FIG. 22B shows a perspective view of autonomous drone 2000 from above and to the left, showing propellers 2208, 2209, 2210, and 2211 mounted to the top of chassis 2202. AI controller 508 can be seen mounted to the top of chassis 2202. Cameras 2214b, 2216a, and 2216b, mounted to the bottom of chassis 2202 are also visible in this view.

Figure 22D:
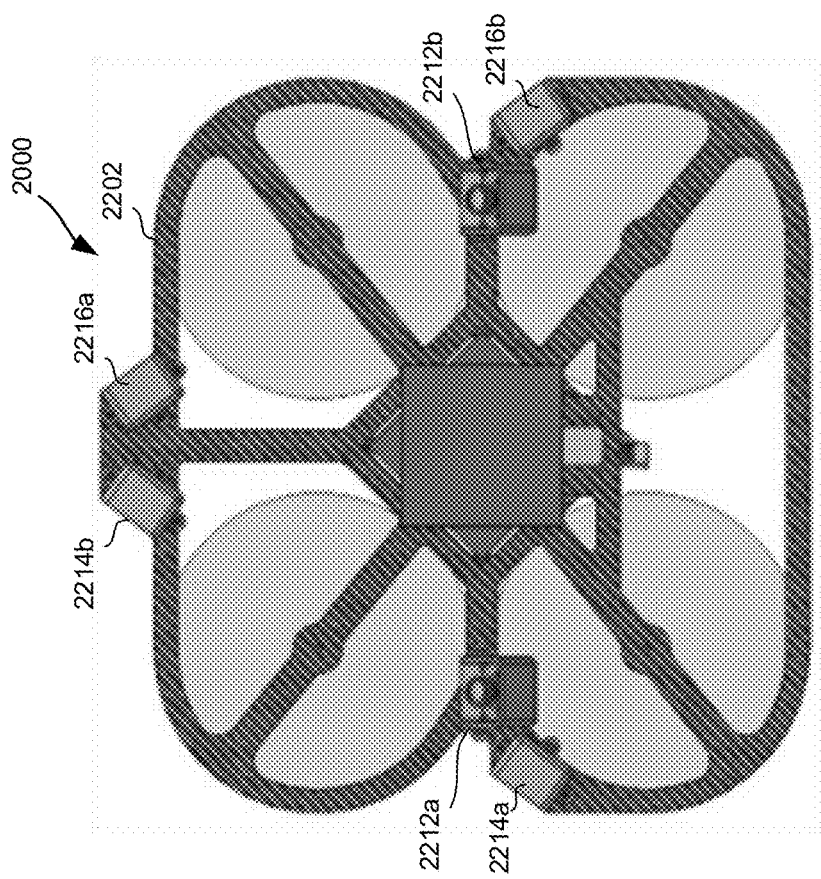
Figure 22C:
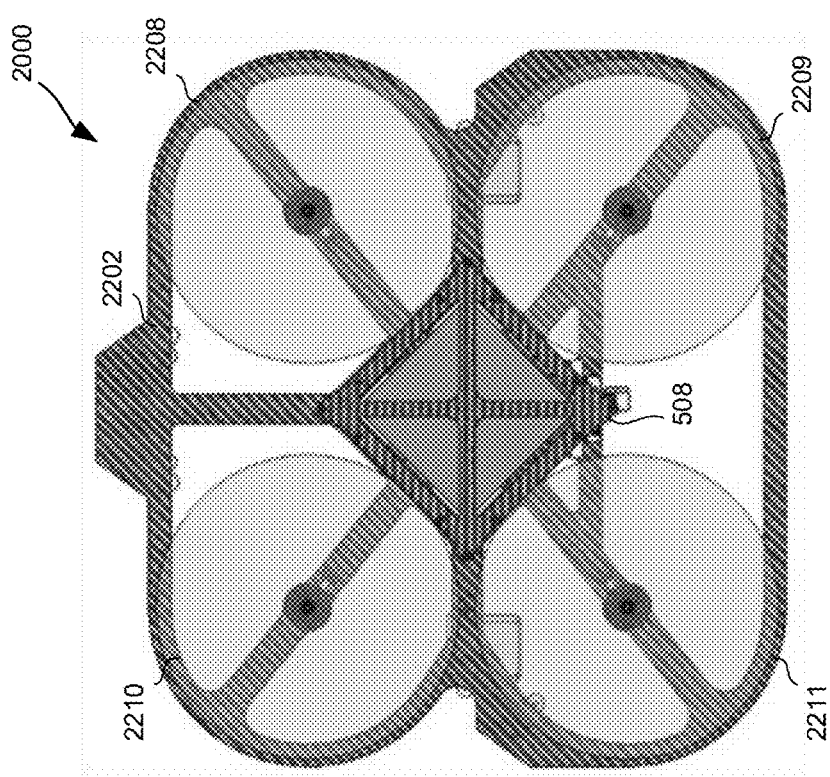

FIG. 22C shows a top-down view of autonomous drone 2000 including propellers 2208, 2209, 2210, 2211 and AI controller 508 mounted on top of chassis 2202.

FIG. 22D shows a bottom-up view of autonomous drone 2000 including cameras 2212a, 2212b, 2214a, 2214b, 2216a, 2216b mounted to the underside of chassis 2202.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. A method of quadcopter simulation comprising;
testing a plurality of quadcopter components at a plurality of operating conditions across their operating ranges to obtain test data;
generating one or more lookup tables for characteristics of the plurality of quadcopter components at the plurality of operating conditions from the test data;
storing the one or more lookup tables for quadcopter component simulation;
subsequently, in a quadcopter simulator, in response to input from a flight controller, receiving a simulated input value for a simulated quadcopter component;
reading one or more entries corresponding to the simulated input value from the one or more lookup tables;
generating a simulated quadcopter component output from the one or more entries; and
generating a simulated quadcopter output to the flight controller according to the simulated quadcopter component output from the one or more entries.

2. The method of claim 1 wherein the plurality of quadcopter components includes one or more of: quadcopter motors, quadcopter propellers, or quadcopter batteries.

3. The method of claim 1 wherein testing includes bench testing a plurality of quadcopter motors from zero revolutions per minute to a maximum number of revolutions per minute and at ten or more points in between.

4. The method of claim 3 wherein bench testing further includes providing commands to the plurality of quadcopter motors to rapidly change a number of Revolutions Per Minute (RPM), recording observed delay in actual change in RPM, and wherein generating the one or more lookup tables includes generating a delay lookup table from the observed delay.

5. The method of claim 4 wherein generating a simulated quadcopter component output includes generating a simulated quadcopter motor RPM with a time delay obtained from the delay lookup table.

6. The method of claim 1 wherein the simulated quadcopter output to the flight controller is generated according to a plurality of lookup tables representing different characteristics of a plurality of quadcopter components, including at least quadcopter motors and propellers.

7. The method of claim 6 wherein the plurality of lookup tables include a current lookup table with entries indicating current for different command inputs, a power lookup table with entries indicating power for different currents, a torque lookup table with entries indicating torque generated for different powers, and an RPM lookup table with entries indicating RPMs generated for different powers.

8. The method of claim 7 further comprising: reducing a power value obtained from the power lookup table according to battery condition to obtain a reduced power value and using the reduced power value to find corresponding entries in the torque lookup table and the RPM lookup table.

9. The method of claim 8 wherein the plurality of lookup tables further includes a delay lookup table with entries indicating delay in changed RPM, a thrust lookup table with entries indicating thrust for different RPM values, and a propeller lookup table with entries indicating propeller efficiency at different RPM values.

10. The method of claim 9 further comprising:
combining a thrust value from the thrust lookup table with a propeller efficiency value from the propeller lookup table to generate a dynamic thrust value; and
providing the dynamic thrust value and a torque value from the torque lookup table in the simulated quadcopter output to the flight controller.

11. A quadcopter simulator comprising:
a flight controller configured to perform Proportional Integral Derivative (PID) control of quadcopter motors to generate flight controller output signals corresponding to four simulated quadcopter motors of a simulated quadcopter;
a virtual powertrain coupled to receive the flight controller output signals, the virtual powertrain configured to generate thrust and torque values for the four simulated quadcopter motors from the flight controller output signals using a plurality of lookup tables with entries indicating quadcopter component characteristics;
an aerodynamic module coupled to receive the thrust and torque values from the virtual powertrain, the aerodynamic module configured to combine the thrust and torque values for the four simulated quadcopter motors and apply additional factors to obtain velocity, angular velocity, and position of the simulated quadcopter, and to provide simulated sensor data according to the velocity, angular velocity, and position to the flight controller; and
a camera simulator coupled to receive the velocity, angular velocity, and position of the simulated quadcopter from the aerodynamic module and to generate a plurality of simulated camera views of simulated cameras of the simulated quadcopter based on the velocity, angular velocity, and position.

12. The quadcopter simulator of claim 11 wherein the aerodynamic module is configured to send the simulated sensor data to an Artificial Intelligence (AI) controller, the camera simulator is configured to send the plurality of simulated camera views to the AI controller, and the flight controller is configured to receive input signals from the AI controller.

13. The quadcopter simulator of claim 12 wherein the flight controller is configured to receive input signals from the AI controller that specify thrust, pitch, roll, and yaw of the simulated quadcopter, and the flight controller output signals are Electronic Speed Control (ESC) signals.

14. The quadcopter simulator of claim 11 wherein the camera simulator is configured to generate six simulated camera views to form three simulated stereoscopic camera views corresponding to different views of a simulated environment around the simulated quadcopter.

15. The quadcopter simulator of claim 11 wherein the plurality of lookup tables include a current lookup table with entries indicating current for different command inputs, a power lookup table with entries indicating power for different currents, a torque lookup table with entries indicating torque generated for different powers, and an RPM lookup table with entries indicating RPMs generated for different powers.

16. The quadcopter simulator of claim 15 wherein the plurality of lookup tables further include a delay lookup table with entries indicating delay in changed RPM, a thrust lookup table with entries indicating thrust for different RPM values, and a propeller lookup table with entries indicating propeller efficiency at different RPM values.

17. The quadcopter simulator of claim 16 further comprising a battery adjustment unit configured to reduce power value obtained from the power lookup table according to battery condition to obtain a reduced power value and provide the reduced power value to find corresponding entries in the torque lookup table and the RPM lookup table.

18. The quadcopter simulator of claim 11 wherein the additional factors include ground effect from proximity of ground below, gravity, lift and drag from movement through air.

19. A quadcopter simulator comprising:
- a flight controller configured to receive commands relating to quadcopter flight, perform Proportional Integral Derivative (PID) control of quadcopter motors to generate four Electronic Speed Control (ESC) signals corresponding to four simulated quadcopter motors of a simulated quadcopter;
- a virtual powertrain coupled to receive the four ESC signals, the virtual powertrain configured to generate thrust and torque values for the four simulated quadcopter motors from the four ESC signals using a plurality of lookup tables with entries indicating quadcopter component characteristics, the lookup tables including: a current lookup table with entries indicating current for different command inputs, a power lookup table with entries indicating power for different currents, a torque lookup table with entries indicating torque generated for different powers, an RPM lookup table with entries indicating RPMs generated for different powers, a delay lookup table with entries indicating delay in changed RPM, a thrust lookup table with entries indicating thrust for different RPM values, and a propeller lookup table with entries indicating propeller efficiency at different RPM values;
- an aerodynamic module coupled to receive the thrust and torque values from the virtual powertrain, the aerodynamic module configured to combine the thrust and torque values for the four simulated quadcopter motors and apply additional factors including ground effect from proximity of ground below, gravity, lift and drag from movement through air, to obtain velocity, angular velocity, and position of the simulated quadcopter, and to provide simulated sensor data according to the velocity, angular velocity, and position to the flight controller; and
- a camera simulator coupled to receive the velocity, angular velocity, and position of the simulated quadcopter from the aerodynamic module and to generate a plurality of simulated stereoscopic camera views of a simulated environment around the simulated quadcopter based on the velocity, angular velocity, and position.

20. The quadcopter simulator of claim 19 wherein the plurality of lookup tables are obtained from bench testing of a plurality of quadcopter components including at least quadcopter motors and propellers under different conditions.

* * * * *